(12) United States Patent
Koyama et al.

(10) Patent No.: US 8,343,847 B2
(45) Date of Patent: Jan. 1, 2013

(54) MANUFACTURING METHOD OF SOI SEMICONDUCTOR DEVICE

(75) Inventors: Masaki Koyama, Atsugi (JP); Junpei Momo, Sagamihara (JP); Eiji Higa, Atsugi (JP); Hiroaki Honda, Atsugi (JP); Tamae Moriwaka, Isehara (JP); Akihisa Shimomura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/575,555

(22) Filed: Oct. 8, 2009

(65) Prior Publication Data

US 2010/0093153 A1    Apr. 15, 2010

(30) Foreign Application Priority Data

Oct. 10, 2008   (JP) ................ 2008-263761

(51) Int. Cl.
*H01L 21/76* (2006.01)
(52) U.S. Cl. ....................................... 438/406
(58) Field of Classification Search ............... 438/406
See application file for complete search history.

(56) References Cited

U.S. PATENT DOCUMENTS

| | | | |
|---|---|---|---|
| 5,374,564 | A | 12/1994 | Bruel |
| 6,372,609 | B1 | 4/2002 | Aga et al. |
| 6,380,046 | B1 | 4/2002 | Yamazaki |
| 6,583,440 | B2 | 6/2003 | Yasukawa |
| 6,706,568 | B2 | 3/2004 | Nakajima |
| 6,803,264 | B2 | 10/2004 | Yamazaki et al. |

(Continued)

FOREIGN PATENT DOCUMENTS

JP    02-054532    2/1990

(Continued)

OTHER PUBLICATIONS

Arokiaraj et al. "Si layer transfer to InP substrate using low-temperature wafer bonding" Applied Surface Science vol. 253, Issue 3, Nov. 30, 2006, pp. 1243-1246.*

*Primary Examiner* — N Drew Richards
*Assistant Examiner* — Grant Withers
(74) *Attorney, Agent, or Firm* — Eric J. Robinson; Robinson Intellectual Property Law Office, P.C.

(57) ABSTRACT

To prevent, in the case of irradiating a single crystal semiconductor layer with a laser beam, an impurity element from being taken into the single crystal semiconductor layer at the time of laser irradiation. In a manufacturing method of an SOI substrate, a single crystal semiconductor substrate and a base substrate are prepared; an embrittlement region is formed in a region at a predetermined depth from a surface of the single crystal semiconductor substrate by irradiating the single crystal semiconductor substrate with accelerated ions; the single crystal semiconductor substrate and a base substrate are bonded to each other with an insulating layer interposed therebetween; a single crystal semiconductor layer is formed over the base substrate with the insulating layer interposed therebetween by heating the single crystal semiconductor substrate to cause separation using the embrittlement region as a boundary; an oxide film formed on the single crystal semiconductor layer is removed; and at least a surface of the single crystal semiconductor layer is melted by irradiating the surface of the single crystal semiconductor layer with a laser beam after the removal of the oxide film. The number of times the single crystal semiconductor layer is melted by the irradiation with the laser beam is one.

15 Claims, 12 Drawing Sheets

U.S. PATENT DOCUMENTS

| | | |
|---|---|---|
| 6,855,584 B2 | 2/2005 | Yamazaki et al. |
| 7,084,046 B2 | 8/2006 | Mitani et al. |
| RE39,484 E | 2/2007 | Bruel |
| 7,476,576 B2 | 1/2009 | Yamazaki et al. |
| 7,707,442 B2 | 4/2010 | Kato |
| 7,727,846 B2* | 6/2010 | Ohnuma et al. ............. 438/311 |
| 7,785,938 B2 | 8/2010 | Yamaguchi et al. |
| 8,003,483 B2* | 8/2011 | Suzawa et al. ............... 438/406 |
| 8,216,914 B2* | 7/2012 | Koyama et al. ............... 438/455 |
| 2005/0064632 A1* | 3/2005 | Sakurada et al. ............ 438/149 |
| 2007/0173000 A1 | 7/2007 | Yamazaki |
| 2009/0004764 A1* | 1/2009 | Ohnuma et al. ............... 438/30 |
| 2009/0004822 A1* | 1/2009 | Murakami et al. ............ 438/458 |
| 2009/0004878 A1 | 1/2009 | Ohnuma et al. |
| 2009/0011575 A1 | 1/2009 | Shimomura et al. |
| 2009/0050941 A1* | 2/2009 | Yamazaki et al. ............ 257/255 |
| 2009/0098674 A1 | 4/2009 | Yamazaki et al. |
| 2009/0098690 A1 | 4/2009 | Yamazaki et al. |
| 2009/0111244 A1 | 4/2009 | Yamazaki et al. |
| 2009/0115029 A1 | 5/2009 | Koyama et al. |
| 2009/0117703 A1* | 5/2009 | Yamazaki .................... 438/406 |
| 2009/0117707 A1 | 5/2009 | Shimomura et al. |
| 2009/0230503 A1 | 9/2009 | Shimomura et al. |
| 2010/0093153 A1* | 4/2010 | Koyama et al. ............... 438/458 |
| 2010/0129948 A1* | 5/2010 | Isaka et al. ...................... 438/57 |
| 2010/0203706 A1 | 8/2010 | Ohnuma et al. |
| 2010/0291755 A1* | 11/2010 | Isaka et al. ..................... 438/458 |

FOREIGN PATENT DOCUMENTS

| | | |
|---|---|---|
| JP | 05-211128 | 8/1993 |
| JP | 11-163363 | 6/1999 |
| JP | 2005-203596 | 7/2005 |
| JP | 2005-252244 | 9/2005 |

* cited by examiner

MANUFACTURING METHOD OF SOI SEMICONDUCTOR DEVICE

BACKGROUND OF THE INVENTION

1. Field of the Invention

The present invention relates to a manufacturing method of a substrate provided with a semiconductor layer with an insulating layer interposed therebetween, and particularly a manufacturing method of an SOI (silicon on insulator) substrate. Further, the present invention relates to a manufacturing method of a semiconductor device in which a substrate provided with a semiconductor layer with an insulating layer interposed therebetween is used.

2. Description of the Related Art

In recent years, integrated circuits using an SOI substrate where a thin single crystal semiconductor layer is formed on an insulating surface, instead of a bulk silicon wafer, have been developed. Since parasitic capacitance between a drain of a transistor and a substrate is reduced by using the SOI substrate, the SOI substrate has attracted attention as one improving performance of semiconductor integrated circuits.

One of the manufacturing methods of SOI substrates is a Smart Cut (registered trademark) method (e.g., see Patent Document 1). An outline of the manufacturing method of an SOI substrate by a Smart Cut method is described below. First, hydrogen ions are implanted into a silicon wafer by an ion implantation method to form a microbubble layer at a predetermined depth from the surface. Then, the silicon wafer into which the hydrogen ions are implanted is bonded to another silicon wafer with a silicon oxide film interposed therebetween. Then, by performing heat treatment, part of the silicon wafer into which hydrogen ions have been implanted is separated in a thin film shape along the microbubble layer which serves as a cleavage plane. Accordingly, a single crystal silicon film can be formed over the other bonded silicon wafer. Here, a Smart Cut method may also be referred to as a hydrogen ion implantation separation method.

Further, a method has also been proposed in which a single crystal silicon layer is formed over a base substrate made of glass by such a Smart Cut method (e.g., see Patent Document 2). Since glass substrates can have a larger area and are less expensive than silicon wafers and are transparent, the glass substrates are mainly used in manufacturing liquid crystal display devices and the like. By using such a glass substrate as a base substrate, a large-sized inexpensive SOI substrate can be manufactured.

In addition, a method of irradiating the single crystal silicon layer with a laser beam for improvement in crystal quality of the single crystal silicon layer is disclosed in Patent Document 2.

[Reference]
[Patent Document]
[Patent Document 1] Japanese Published Patent Application No. H05-211128
[Patent Document 2] Japanese Published Patent Application No. 2005-252244

SUMMARY OF THE INVENTION

As disclosed in Patent Document 2, by irradiation of the single crystal semiconductor layer with a laser beam, even in the case where a glass substrate with low heat resistance or the like is used, the single crystal semiconductor layer is melted and thus crystallinity thereof can be increased. However, in the case where any treatment is not performed in the laser irradiation, there is a possibility that an impurity element in an atmosphere such as carbon is taken into the semiconductor layer, whereby characteristics of an element in which the single crystal semiconductor layer is used are adversely affected.

In particular, in the case where the above-described impurity element is contained in an oxide film or the like which is formed on the surface of the single crystal semiconductor layer, the oxide film is melted at the time of melting of the single crystal semiconductor layer by the laser irradiation; accordingly, the impurity element is taken into the single crystal semiconductor layer at a high concentration.

The impurity element deteriorates characteristics of the semiconductor element and causes reduction of reliability. Therefore, in order to keep favorable element characteristics and increase the reliability, it is important not to increase the impurity element in the single crystal semiconductor layer.

In view of the aforementioned problem, it is an object of an embodiment of the disclosed invention to prevent, in the case of irradiating the single crystal semiconductor layer with a laser beam, the impurity element from being taken into the single crystal semiconductor layer at the time of laser irradiation.

According to an embodiment of the disclosed invention, one aspect is that after an oxide film on a surface of a single crystal semiconductor layer is removed, laser irradiation is performed in a manufacturing method of an SOI substrate.

According to an embodiment of the disclosed invention, a manufacturing method of an SOI substrate includes the steps of forming an embrittlement region in a region at a predetermined depth from a surface of a single crystal semiconductor substrate by irradiating the single crystal semiconductor substrate with accelerated ions; bonding the single crystal semiconductor substrate and a base substrate to each other with an insulating layer interposed therebetween; forming a single crystal semiconductor layer over the base substrate with the insulating layer interposed therebetween by heating the single crystal semiconductor substrate to cause separation using the embrittlement region as a boundary; removing an oxide film formed on the single crystal semiconductor layer; and melting at least a surface of the single crystal semiconductor layer by irradiating the surface of the single crystal semiconductor layer with a laser beam after the removal of the oxide film, in which the number of times the single crystal semiconductor layer is melted by the irradiation with the laser beam is one.

In the above-described method, the single crystal semiconductor layer may have a thickness of 200 nm or more, and a laser beam emitted from a pulsed laser having a repetition rate of 10 MHz or higher or a continuous wave laser may be used as the laser beam. Further, it is preferable that the single crystal semiconductor layer be partially melted by the irradiation with the laser beam.

In the above-described method, the single crystal semiconductor layer irradiated with the laser beam has a carbon concentration of $1 \times 10^{19}$ atoms/cm$^3$ or less, preferably $5 \times 10^{18}$ atoms/cm$^3$ or less. Further, a glass substrate can be used as the base substrate.

In this specification, the term "single crystal" means a crystal in which, when a certain crystal axis is focused, the direction of the crystal axis is oriented in the same direction in any portion of a sample and which has no crystal grain boundaries between crystals. Note that, in this specification, the single crystal also means a crystal in which the direction of crystal axes is uniform and which has no grain boundaries as described above even when it includes a crystal defect or a dangling bond. In addition, re-single-crystallization of a single crystal semiconductor layer means that a semiconductor layer having a single crystal structure returns to a single crystal structure after being in a different state from the single crystal structure (e.g., a liquid-phase state). In addition, it can be said that re-single-crystallization of a single crystal semiconductor layer means that a single crystal semiconductor layer is recrystallized to form a single crystal semiconductor layer.

Note that semiconductor devices in this specification mean all devices which can function by utilizing semiconductor characteristics, and electro-optical devices, semiconductor circuits, and electronic devices are all semiconductor devices.

In addition, in this specification, the term "display devices" include a light-emitting device and a liquid crystal display device. The light-emitting device includes a light-emitting element, and the liquid crystal display device includes a liquid crystal element. A light-emitting element includes, in its scope, an element whose luminance is controlled by current or voltage, and specifically includes an inorganic electroluminescent (EL) element, an organic EL element, and the like.

In an embodiment of the disclosed invention, an oxide film formed on a surface of a single crystal semiconductor layer is removed and then laser irradiation is performed. Thus, an impurity element contained in the oxide film is not taken into the single crystal semiconductor layer, whereby increase of the impurity element in the single crystal semiconductor layer can be suppressed. In addition, the number of times the single crystal semiconductor layer is melted by laser irradiation is one. In this manner, the impurity element contained in a surface oxide film, which is formed at the time of solidification after the irradiation, is not taken into the single crystal semiconductor layer by the second or later melting. Therefore, increase of the impurity element in the single crystal semiconductor layer can be suppressed.

BRIEF DESCRIPTION OF THE DRAWINGS

In the accompanying drawings:

FIGS. 3A1 to 3A3, FIGS. 3B1 and 3B2, FIG. 3C, and FIG. 3D illustrate an example of a manufacturing method of an SOI substrate;

DETAILED DESCRIPTION OF THE INVENTION

Figure 1A:
FIGS. 1A to 1F illustrate an example of a manufacturing method of an SOI substrate.

Embodiments of the present invention will be described with reference to the accompanying drawings. However, the present invention can be implemented in various different ways, and it will be easily understood by those skilled in the art that various changes and modifications can be made in modes and details without departing from the spirit and scope of the present invention. Therefore, the present invention should not be construed as being limited to the description of the following embodiments. Note that a common reference numeral refers to the same part or a part having a similar function throughout all the drawings used for describing the embodiments, and the description thereof is omitted.

[Embodiment 1]

In Embodiment 1, an example of a manufacturing method of an SOI substrate will be described with reference to drawings. Specifically, a process in which a single crystal semiconductor layer is formed over a base substrate with an insulating layer interposed therebetween by a Smart Cut method and crystal quality of the single crystal semiconductor layer is improved will be described.

Figure 1B:

First, a single crystal semiconductor substrate 100 and a base substrate 120 are prepared (see FIGS. 1A and 1B).

As the single crystal semiconductor substrate 100, a single crystal semiconductor substrate formed using an element of Group 14, such as a single crystal silicon substrate, a single crystal germanium substrate, or a single crystal silicon germanium substrate, can be used. Alternatively, a compound semiconductor substrate formed using gallium arsenide, indium phosphide, or the like can be used. The size of a commercial silicon substrate is typically a circular substrate which is 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 100 is not limited to a circular shape. For example, a single crystal semiconductor substrate processed into a rectangular shape or the like can also be used.

As the base substrate 120, a substrate made of an insulator can be used. In particular, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. Alternatively, a single crystal semiconductor substrate (e.g., a single crystal silicon substrate, or the like) may be used as the base substrate 120. In this embodiment, a case of using a glass substrate is described. With use of a glass substrate which can have a large area and is inexpensive as the base substrate 120, the cost can be reduced.

Figure 1C:
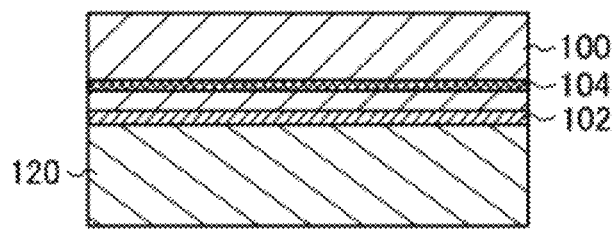

Next, an embrittlement region 104 whose crystal structure is damaged is formed at a predetermined depth from a surface of the single crystal semiconductor substrate 100, and then the single crystal semiconductor substrate 100 and the base substrate 120 are attached to each other with an insulating layer 102 interposed therebetween (see FIG. 1C).

The embrittlement region 104 can be formed by irradiating the single crystal semiconductor substrate 100 with ions of hydrogen or the like having kinetic energy.

The insulating layer 102 can be formed using a single layer or stacked layers of a silicon oxide film, a silicon oxynitride film, a silicon nitride film, a silicon nitride oxide film, or the like. These films can be formed by a thermal oxidation method, a CVD method, a sputtering method, or the like.

In this specification, "silicon oxynitride" refers to a substance that contains more oxygen than nitrogen, and preferably oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively in the case where measurements are performed by Rutherford backscattering spectrometry (RBS) and hydrogen forward scattering spectrometry (HFS). Further, "silicon nitride oxide" refers to a substance that contains more nitrogen than oxygen, and preferably oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively in the case where measurements are performed by RBS and HFS. Note that percentages of nitrogen, oxygen, silicon, and hydrogen fall within the ranges given above, where the total number of atoms contained in the silicon oxynitride or the silicon nitride oxide is defined as 100 at. %.

Figure 1D:
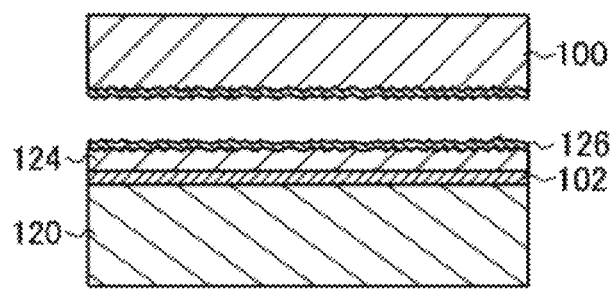

Next, a single crystal semiconductor layer 124 is provided over the base substrate 120 with the insulating layer 102 interposed therebetween by separation along the embrittlement region 104 using heat treatment (see FIG. 1D).

When the heat treatment is performed, the element added is separated out in microvoids which are formed in the embrittlement region 104, and the internal pressure of the microvoids is increased. By the increase in pressure, the microvoids in the embrittlement region 104 is changed in volume and a crack is generated in the embrittlement region 104. Thus, the single crystal semiconductor substrate 100 is separated along the embrittlement region 104. Since the insulating layer 102 is bonded to the base substrate 120, the single crystal semiconductor layer 124 which is separated from the single crystal semiconductor substrate 100 is formed over the base substrate 120.

Then, a step of irradiating a surface of the single crystal semiconductor layer 124 formed over the base substrate 120 with a laser beam is performed. By irradiation of the single crystal semiconductor layer 124 with a laser beam, crystallinity of the single crystal semiconductor layer 124 can be improved and the surface thereof can be made smooth.

Figure 1E:
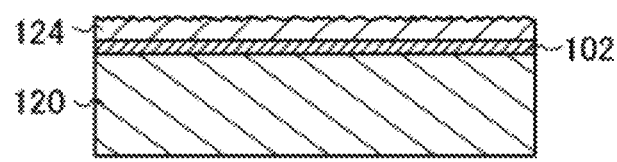

In this embodiment, before irradiation of the single crystal semiconductor layer 124 with a laser beam, an oxide film 126 which is formed on the surface of the single crystal semiconductor layer 124 after separation is removed (see FIG. 1E). The oxide film 126 is an oxide film formed due to heat treatment or the like and contains an impurity element used for the treatment atmosphere. Accordingly, in the case where the single crystal semiconductor layer 124 provided with the oxide film 126 is irradiated with a laser beam so as to be melted, there is a possibility that the impurity element such as carbon is taken into the single crystal semiconductor layer 124.

Specifically, the oxide film 126 can be removed by cleaning treatment with the use of, for example, hydrofluoric acid or the like. The treatment with the use of hydrofluoric acid may be performed until the surface of the single crystal semiconductor layer 124 becomes water repellent. Whether the oxide film 126 on the surface of the single crystal semiconductor layer 124 is removed can be checked by whether the surface thereof shows a water repellent property.

Note that the oxide film 126 is not limited to an oxide film formed due to heat treatment, and may be an oxide film formed due to other treatments. Needless to say, the oxide film 126 also means an oxide film formed without any particular treatment, such as a native oxide film.

Then, treatment such as plasma treatment may be further performed on the surface of the single crystal semiconductor layer 124 to remove impurities (including carbon, nitrogen, oxygen, and the like) which are attached to the surface of the single crystal semiconductor layer 124.

Figure 1F:
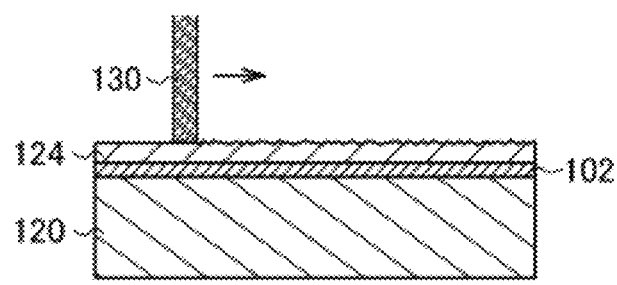

Next, by irradiating the surface of the single crystal semiconductor layer 124 formed over the base substrate 120 with a laser beam 130, the crystal quality of the single crystal semiconductor layer 124 is improved (recrystallization) (see FIG. 1F).

In a surface portion of the single crystal semiconductor layer 124, crystal defects or the like are generated due to formation of the embrittlement region 104, separation along the embrittlement region 104, or the like, and the crystallinity is damaged. Accordingly, as illustrated in FIG. 1F, the surface of the single crystal semiconductor layer 124 is irradiated with the laser beam 130 to melt at least the surface portion of the single crystal semiconductor layer 124, whereby the crystal quality can be improved. Although surface unevenness is caused in the single crystal semiconductor layer 124 after separation, the surface can be made smooth by melting the surface portion of the single crystal semiconductor layer 124. Note that the crystallinity of the single crystal semiconductor layer 124 can be evaluated by observation with an optical microscope, Raman shift and a full width at half maximum which are obtained from a Raman spectroscopy spectrum, or the like.

In this embodiment, it is preferable that by irradiating the single crystal semiconductor layer 124 with the laser beam 130 from the surface side of the single crystal semiconductor layer 124 which is exposed by the separation, the single crystal semiconductor layer 124 is not completely melted but is melted partially (partial melting). To partially melt the single crystal semiconductor layer 124 refers to melting the single crystal semiconductor layer 124 so that the depth of the melted portion of the single crystal semiconductor layer 124 by irradiation with the laser beam 130 is shallower than an interface with the insulating layer 102 (the thickness of the single crystal semiconductor layer 124). That is, it refers to a state where an upper layer of the single crystal semiconductor layer 124 is melted to become a liquid phase and a lower layer thereof is not melted and remains in a solid phase.

By partial melting of the single crystal semiconductor layer 124, crystal growth of the portion melted by irradiation with the laser beam 130 can be performed based on plane orientation of the unmelted portion of the single crystal semiconductor layer, whereby recrystallization can be performed with the plane orientation aligned as compared to the case of complete melting. Further, by melting the single crystal semiconductor layer 124 partially, an impurity element such as oxygen, nitrogen, or the like from the insulating layer 102 can be prevented from being taken into the single crystal semiconductor layer 124.

Further, in this embodiment, the number of times the single crystal semiconductor layer 124 is melted by irradiation with the laser beam 130 is one. Here, one-time melting means that the same region in the surface portion of the single crystal semiconductor layer 124 is not melted two times or more. In other words, the surface portion of the single crystal semiconductor layer 124 is solidified after one-time melting and melting is not caused two times or more in the same region that is solidified after one-time melting. Accordingly, in the case where different regions in the single crystal semiconductor layer 124 are each melted once, the number of melting times is one.

Thus, in the case where the number of times the single crystal semiconductor layer 124 is melted is one, an oxide film containing an impurity element can be prevented from being newly formed on the surface of the single crystal semiconductor layer 124 after solidification, whereby the impurity element can be prevented from being taken into the single crystal semiconductor layer 124 through another melting process.

Here, the relation between the number of melting times and the increase of an impurity element in the single crystal semiconductor layer will be described with reference to FIGS. 2A to 2E. Since FIGS. 2A to 2E are used for explaining melting of the single crystal semiconductor layer 124, the elements which do not have a large influence on the melting process (e.g., the base substrate 120 and the like) are omitted.

Figure 2A:
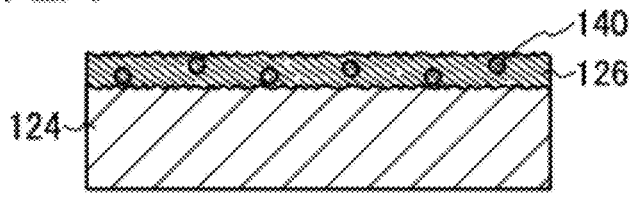
FIGS. 2A to 2E illustrate a relation between the number of melting times and the increase of an impurity element.
Figure 2B:

As described above, the oxide film 126 is formed on the surface of the single crystal semiconductor layer 124 after separation due to heat treatment or the like (see FIG. 2A). An impurity element 140 is taken into the oxide film 126. In the case where the single crystal semiconductor layer 124 is melted by irradiation with a laser beam in this state, the impurity element is taken into the single crystal semiconductor layer. Therefore, the oxide film 126 is removed in this embodiment (see FIG. 2B).

Figure 2C:
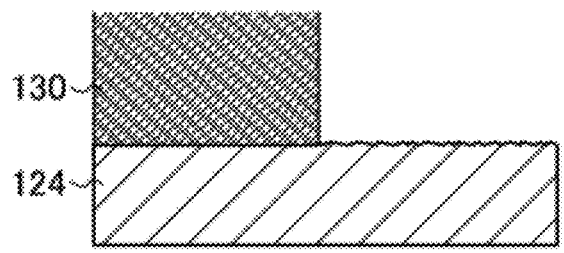

Next, the surface of the single crystal semiconductor layer 124 is irradiated with the laser beam 130, so that the crystal quality of the single crystal semiconductor layer 124 is improved (see FIG. 2C). Since the oxide film 126 is removed in this stage, the impurity element from the oxide film 126 is not taken into the single crystal semiconductor layer 124.

Figure 2D:
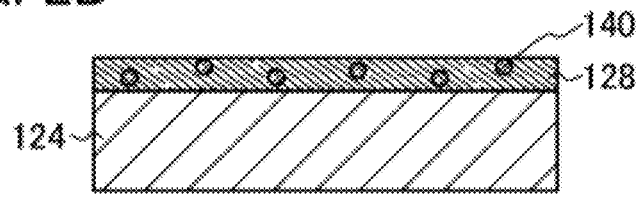

Then, when the melted single crystal semiconductor layer 124 is solidified, an oxide film 128 is newly formed on the surface (see FIG. 2D). Since the temperature of the surface portion of the single crystal semiconductor layer 124 is significantly high right after the melting, it seems that the oxide film 128 is generated by thermal oxidation of the single crystal semiconductor layer 124 after solidification.

The impurity element 140 due to a treatment atmosphere or the like exists in the oxide film 128 formed in the above-described manner. Therefore, under such a situation as to melt the single crystal semiconductor layer 124 again, such as the case of irradiating the same region again with a laser beam, the impurity element 140 in the oxide film 128 is diffused and taken into the single crystal semiconductor layer 124 (see FIG. 2E).

Figure 2E:
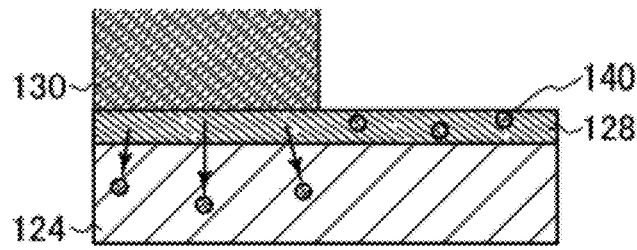

In order to prevent this, this embodiment employs one-time melting of the single crystal semiconductor layer 124 by irradiation with the laser beam 130 without the step of FIG. 2E. Note that in the case of removing the oxide film 128, irradiation with a laser beam can be performed again.

As a laser that can be used for irradiation with the above-described laser beam 130, a pulsed laser or a continuous wave laser (a CW laser) can be given. In the case where a pulsed laser is used and its repetition rate is low, it is preferable that the same region is not irradiated with two or more pulsed laser beams. That is, it is preferable that pulsed laser beams do not overlap with each other. This is because, in the case of the above-described pulsed laser, the single crystal semiconductor layer 124 is solidified after irradiation with a first pulse and before irradiation with a second pulse, and an oxide film is formed on the surface.

Even in the case of using a pulsed laser, if the repetition rate is high, the pulsed laser beams may overlap with each other because the single crystal semiconductor layer is not solidified and remains melted after irradiation with a first pulse and before irradiation with a second pulse. As a pulsed laser with a high repetition rate, a pulsed laser with a repetition rate of 10 MHz or higher can be used, for example.

In the case of using a continuous wave laser, this problem is not caused; accordingly, irradiation may be performed so as to realize partial melting by appropriately setting conditions such as irradiation time.

In the case where the single crystal semiconductor layer 124 is thick (e.g., having a thickness of 200 nm or more), a continuous wave laser is preferably used because the continuous wave laser has high energy stability and enables crystal quality to be obtained stably. On the other hand, in the case where the single crystal semiconductor layer 124 is thin (e.g., having a thickness of less than 200 nm), a pulsed laser is preferably used. This is because in order to realize partial melting in the case where the single crystal semiconductor layer 124 is thin, the irradiation time of a laser beam needs to be short in terms of the heat conduction.

Further, the laser beam 130 needs to have such a wavelength that the laser beam 130 is absorbed by the single crystal semiconductor layer 124. The wavelength of the laser beam 130 may be selected from a range from ultraviolet light to visible light (e.g., 250 nm to 700 nm, inclusive). For example, in the case where the single crystal semiconductor layer 124 is thick (the case where the thickness is 200 nm or more), it is preferable to irradiate the single crystal semiconductor layer 124 with a laser beam having a relatively long wavelength of 500 nm or longer because the laser beam can reach a deep region of the single crystal semiconductor layer 124. Generally, the wavelength of the laser beam can be determined in consideration of the skin depth of the laser beam and the like.

For example, in the case where the single crystal semiconductor layer 124 is formed using a silicon material and thick (e.g., the thickness is 200 nm or more), it is preferable to employ visible light because the depth to which the visible light enters the single crystal semiconductor layer 124 can be made large and the visible light can heat the single crystal semiconductor layer 124 to the bottom. On the contrary, in the case where the single crystal semiconductor layer 124 is thin, it is preferable to employ near-ultraviolet light because the depth to which the near-ultraviolet light enters the single crystal semiconductor layer 124 can be made small, whereby an influence of heat on the base substrate can be suppressed.

The range of the energy density of the laser beam to partially melt the single crystal semiconductor layer 124 is such an energy density that the single crystal semiconductor layer 124 is not completely melted, which is set in consideration of the wavelength of the laser beam, the skin depth of the laser beam, the thickness of the single crystal semiconductor layer 124, and the like. For example, in the case where the thickness of the single crystal semiconductor layer 124 is large, the energy to completely melt the single crystal semiconductor layer 124 is high, and thus the range of the energy density of the laser beam can be wide. In addition, when the thickness of the single crystal semiconductor layer 124 is small, the energy to completely melt the single crystal semiconductor layer 124 is low, and thus the energy density of the laser beam is preferably small. Note that in the case where the single crystal semiconductor layer 124 is irradiated with the laser beam while being heated, the upper limit of the range of the energy density needed for partial melting is preferably set lower, in order to prevent complete melting of the single crystal semiconductor layer 124.

Further, irradiation with the laser beam 130 may be performed in a chamber with a reduced-pressure atmosphere. With a reduced-pressure atmosphere, an impurity element in the atmosphere can be prevented from being taken into the single crystal semiconductor layer 124 even when the single crystal semiconductor layer 124 is melted by irradiation with the laser beam 130. Thus, the concentration of the impurity element contained in the single crystal semiconductor layer 124 is not increased by the irradiation step with the laser beam 130.

In order to prevent an impurity element from being taken into the single crystal semiconductor layer 124 in the irradiation step with the laser beam 130, cleaning treatment of the chamber may be performed before the irradiation with the laser beam. As examples of the cleaning treatment, treatment with silane gas, treatment with hydrogen gas, and the like can be given. Here, the treatment with silane gas and the treatment with hydrogen gas are called silane flush and hydrogen flush respectively (also collectively referred to as flushing treatment), and such cleaning treatments are performed by making reactive gas flow at a predetermined flow rate for a predetermined period of time.

The above-described cleaning treatment is more effective when it is performed after cleaning treatment with fluorine radicals is performed, for example. Fluorine radicals can be generated in the following manner: fluorine or the like is introduced in a plasma generator provided at an outside of the chamber or the like and dissociated therein.

By the method described in this embodiment, crystal quality is improved by irradiating the single crystal semiconductor layer formed over the base substrate with a laser beam so as to melt the single crystal semiconductor layer, and even in the case where the surface is made smooth, the impurity element can be prevented from being taken into the single crystal semiconductor layer in the irradiation step with the laser beam.

As described above, the oxide film formed on the surface of the single crystal semiconductor layer is removed and then laser irradiation is performed in this embodiment. Thus, the impurity element contained in the oxide film is not taken into the single crystal semiconductor layer, whereby increase of the impurity element in the single crystal semiconductor layer can be suppressed. In addition, the number of times the single crystal semiconductor layer is melted by laser irradiation is one. In this manner, the impurity element contained in a surface oxide film, which is formed at the time of solidification after the irradiation, is not taken into the single crystal semiconductor layer by the second or later melting. Therefore, increase of the impurity element in the single crystal semiconductor layer can be suppressed.

Note that the structure and method described in this embodiment can be implemented in combination with any of the structures and methods described in other embodiments in this specification, as appropriate.

[Embodiment 2]

In Embodiment 2, bonding of the single crystal semiconductor substrate 100 and the base substrate 120 will be described in detail with reference to drawings.

First, the single crystal semiconductor substrate 100 is prepared (see FIG. 3A1). In terms of removing contaminants, it is preferable that a surface of the single crystal semiconductor substrate 100 be cleaned in advance using a sulfuric acid/hydrogen peroxide mixture (SPM), an ammonium hydroxide/hydrogen peroxide mixture (APM), a hydrochloric acid/hydrogen peroxide mixture (HPM), diluted hydrofluoric acid (DHF), or the like as appropriate. Alternatively, diluted hydrofluoric acid and ozone water may be discharged alternately to clean the surface of the single crystal semiconductor substrate 100.

Next, an oxide film 132 is formed on the surface of the single crystal semiconductor substrate 100 (see FIG. 3A2).

As the oxide film 132, for example, a single layer of a silicon oxide film, a silicon oxynitride film, or the like, or a stacked layer thereof can be used. These films can be formed by a thermal oxidation method, a CVD method, a sputtering method, or the like. In addition, in the case where the oxide film 132 is formed by a CVD method, it is preferable to use a silicon oxide film formed using organosilane such as tetraethoxysilane (abbreviation: TEOS, chemical formula: $Si(OC_2H_5)_4$) as the oxide film 132 in terms of productivity.

In this embodiment, thermal oxidation treatment is performed on the single crystal semiconductor substrate 100 to form the oxide film 132 (here, a SiOx film) (see FIG. 3A2).

The thermal oxidation treatment is preferably performed in an oxidation atmosphere to which halogen is added. For example, the thermal oxidation treatment (HCl oxidation) is performed on the single crystal semiconductor substrate 100 in an oxidation atmosphere to which chlorine (Cl) is added, whereby the oxide film 132 is formed through oxidation. In this case, the oxide film 132 is a film containing chlorine atoms.

The chlorine atoms which are contained in the oxide film 132 form a distortion. As a result, the ratio of absorption of moisture of the oxide film 132 is increased and the diffusion speed is increased. That is, in the case where moisture exists on the surface of the oxide film 132, moisture on the surface can be rapidly absorbed and diffused into the oxide film 132.

As an example of the thermal oxidation treatment, thermal oxidation can be performed in an oxidation atmosphere containing hydrogen chloride (HCl) at 0.5 vol % to 10 vol % (preferably 3 vol %) with respect to oxygen, at a temperature of 900° C. to 1150° C. (typically, 1000° C.). The treatment time may be 0.1 to 6 hours, preferably 0.5 to 1 hour. The thickness of the formed oxide film is 10 nm to 1000 nm (preferably, 50 nm to 300 nm), for example, 100 nm.

In this embodiment, the concentration of chlorine atoms contained in the oxide film 132 is controlled to be $1\times10^{17}$ atoms/cm$^3$ to $1\times10^{21}$ atoms/cm$^3$. Chlorine atoms are contained in the oxide film 132, whereby a heavy metal (e.g., Fe, Cr, Ni, Mo, or the like) which is an extrinsic impurity is captured and thus the single crystal semiconductor substrate 100 can be prevented from being contaminated.

When halogen such as chlorine is contained in the oxide film 132 by HCl oxidation or the like, an impurity which adversely affects the single crystal semiconductor substrate (e.g., a mobile ion such as Na) can be gettered. That is, by the heat treatment performed after the oxide film 132 is formed, an impurity contained in the single crystal semiconductor substrate is separated out to the oxide film 132 and reacted with halogen (e.g., chlorine) to be captured. Thus, the impurity captured in the oxide film 132 can be fixed and contamination of the single crystal semiconductor substrate 100 can be prevented. In addition, when the oxide film 132 is attached to a glass substrate, the oxide film 132 functions as a film which fixes an impurity such as Na contained in glass.

In particular, it is effective that halogen such as chlorine is contained in the oxide film 132 by HCl oxidation or the like for removing contaminants in the case where a semiconductor substrate is not cleaned sufficiently or the case where a semiconductor substrate that is reused repeatedly is used.

Further, halogen atoms contained in the oxide film 132 are not limited to the chlorine atoms. Fluorine atoms may be contained in the oxide film 132. For example, thermal oxidation treatment may be performed on the single crystal semiconductor substrate 100 in an oxidation atmosphere after the single crystal semiconductor substrate 100 is immersed in an HF solution, or thermal oxidation treatment may be performed in an oxidation atmosphere to which $NF_3$ is added.

Next, the single crystal semiconductor substrate 100 is irradiated with ions having kinetic energy to form the embrittlement region 104 having a damaged crystal structure at a predetermined depth in the single crystal semiconductor substrate 100 (see FIG. 3A3). As illustrated in FIG. 3A3, the single crystal semiconductor substrate 100 is irradiated with accelerated ions 103 through the oxide film 132, and the ions 103 are added to a region at a predetermined depth from the surface of the single crystal semiconductor substrate 100;

thus, the embrittlement region 104 can be formed. The ions 103 are obtained in such a manner that a source gas is excited to produce plasma of the source gas and the ions contained in the plasma are extracted from the plasma by an electric field effect and accelerated.

The depth of the region where the embrittlement region 104 is formed can be adjusted by the kinetic energy, the mass, the charge, and the incidence angle of the ions 103. The kinetic energy can be adjusted by the acceleration voltage or the like. Note that the embrittlement region 104 is formed at the same depth or substantially the same depth as the average penetration depth of the ions 103. Therefore, the thickness of the single crystal semiconductor layer separated from the single crystal semiconductor substrate 100 can be determined by the depth to which the ions 103 are added. The depth at which the embrittlement region 104 is formed is adjusted so that the thickness of the single crystal semiconductor layer becomes 10 nm to 500 nm inclusive, preferably 50 nm to 200 nm inclusive.

The embrittlement region 104 can be formed by ion doping treatment. The ion doping treatment can be performed with an ion doping apparatus. A typical example of the ion doping apparatus is a non-mass-separation type apparatus which irradiates a process object which is disposed in a chamber with all kinds of ions which are generated by plasma excitation of a process gas. The apparatus is called "non-mass-separation type apparatus" because a process object is irradiated with all kinds of ions without mass-separating ions in plasma. In contrast, an ion implantation apparatus is a mass-separation type apparatus. The ion implantation apparatus is an apparatus with which a process object is irradiated with ion species having a specific mass through mass separation of ion species in plasma.

The ion doping apparatus includes a chamber in which a process object is disposed, an ion source for generating desired ions, an acceleration mechanism for acceleration of ions and for irradiation therewith, and the like. The ion source includes a gas supply device for supplying a source gas to generate a desired ion species, an electrode for exciting the source gas to generate plasma, and the like. As the electrode for generating plasma, a filament type electrode, a capacitive coupling high-frequency discharging electrode, or the like is used. The acceleration mechanism includes electrodes such as an extraction electrode, an acceleration electrode, a deceleration electrode, and a ground electrode; a power source for supplying power to these electrodes; and the like. These electrodes that are included in the acceleration mechanism are provided with a plurality of openings or slits, through which ions that are generated from the ion source are accelerated. Note that the components of the ion doping apparatus are not limited to the above-mentioned components, and a mechanism as needed is provided.

In this embodiment, hydrogen is added to the single crystal semiconductor substrate 100 with an ion doping apparatus. A hydrogen-containing gas is supplied as a plasma source gas. For example, $H_2$ is supplied. Plasma is generated by excitation of a hydrogen gas. Ions contained in the plasma are accelerated without mass separation and the single crystal semiconductor substrate 100 is irradiated with the accelerated ions.

In the ion doping apparatus, the percentage of $H_3^+$ to the total quantity of ion species ($H^+$, $H_2^+$, and $H_3^+$) generated from a hydrogen gas is set to be 50% or higher. Preferably, the percentage of $H_3^+$ is set to be 80% or higher. Since mass separation is not performed in the ion doping apparatus, the percentage of one kind ($H_3^+$) to plural kinds of ion species generated in plasma is preferably set to be 50% or higher, more preferably 80% or higher. By irradiation with ions having the same mass, ions can be added in a concentrated manner to the same depth in the single crystal semiconductor substrate 100.

In order to form the embrittlement region 104 in a shallow region, the acceleration voltage of the ions 103 should be low. However, by increasing the percentage of $H_3^+$ ions in the plasma, atomic hydrogen (H) can be added to the single crystal semiconductor substrate 100 efficiently. Since the mass of $H_3^+$ ions is three times as large as that of $H^+$ ions, in the case where one hydrogen atom is added to the same depth, the acceleration voltage of $H_3^+$ ions can be three times as high as that of $H^+$ ions. When the acceleration voltage of ions can be increased, the takt time of an ion irradiation step can be shortened, and productivity and throughput can be improved.

Ion doping apparatuses are inexpensive and excellent for use in large-area treatment. Therefore, by irradiation with $H_3^+$ with the use of such an ion doping apparatus, significant effects such as improvement in semiconductor characteristics, increase in area, reduction in cost, and improvement in productivity can be obtained. Further, in the case where an ion doping apparatus is used, there is a concern that a heavy metal is also introduced to the substrate at the same time. However, by irradiation with the ions through the oxide film 132 containing chlorine atoms, contamination of the single crystal semiconductor substrate 100 due to such a heavy metal can be prevented as described above.

Note that the step of irradiating the single crystal semiconductor substrate 100 with the accelerated ions 103 can also be performed with an ion implantation apparatus. The ion implantation apparatus is a mass-separation type apparatus with which a process object that is disposed in a chamber is irradiated with a specific ion species through mass separation of a plurality of ion species that are generated by plasma excitation of a source gas. Thus, in the case where an ion implantation apparatus is used, $H^+$ ions and $H_2^+$ ions that are generated by excitation of a hydrogen gas or a $PH_3$ gas are subjected to mass separation, and either $H^+$ ions or $H_2^+$ ions are accelerated, with which the single crystal semiconductor substrate 100 is irradiated.

Next, the base substrate 120 is prepared (see FIG. 3B1).

As the base substrate 120, a substrate made of an insulator is used. Specifically, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. In this embodiment, a case of using a glass substrate will be described. With the use of a glass substrate which can have a large area and is inexpensive as the base substrate 120, cost can be reduced.

In addition, it is preferable that a surface of the base substrate 120 be cleaned in advance before the base substrate 120 is used. Specifically, ultrasonic cleaning is performed on the base substrate 120 using a hydrochloric acid/hydrogen peroxide mixture (HPM), a sulfuric acid/hydrogen peroxide mixture (SPM), an ammonium hydroxide/hydrogen peroxide mixture (APM), diluted hydrofluoric acid (DHF), or the like. For example, ultrasonic cleaning is preferably performed on the surface of the base substrate 120 using a hydrochloric acid/hydrogen peroxide mixture. The surface of the base substrate 120 can be planarized and abrasive particles left on the surface of the base substrate 120 can be removed by performing such cleaning treatment.

Next, a nitrogen-containing layer 121 (e.g., an insulating film containing nitrogen such as a silicon nitride film or a silicon nitride oxide film) is formed on the surface of the base substrate 120 (see FIG. 3B2).

In this embodiment, the nitrogen-containing layer 121 serves as a layer (a bonding layer) bonded to the oxide film 132 which is provided over the single crystal semiconductor substrate 100. In addition, when the single crystal semiconductor layer having a single crystal structure is provided over the base substrate later, the nitrogen-containing layer 121 functions as a barrier layer for preventing impurities such as sodium (Na) contained in the base substrate from diffusing into the single crystal semiconductor layer.

In addition, the surface of the nitrogen-containing layer 121 is preferably smoothed in order to suppress defective bonding between the single crystal semiconductor substrate 100 and the base substrate 120. Specifically, the nitrogen-containing layer 121 is formed so that the average surface roughness (Ra) of the surface of the nitrogen-containing layer 121 is 0.5 nm or less and the root-mean-square surface roughness (Rms) is 0.60 nm or less; more preferably, Ra is 0.35 nm or less and Rms is 0.45 nm or less. The thickness is preferably in the range of 10 nm to 200 nm inclusive, more preferably, 50 nm to 100 nm inclusive.

Figure 3C:
Figure 3C:
Figure 3C:
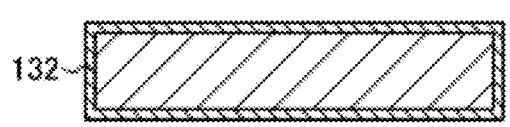
Figure 3C:
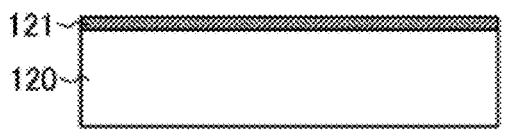
Figure 3C:
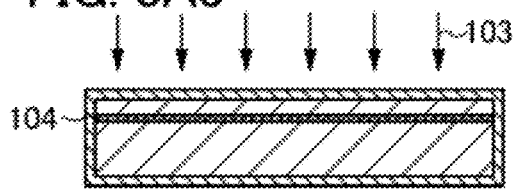
Figure 3C:
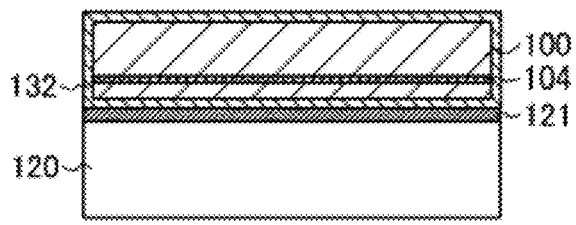

Next, the surface of the single crystal semiconductor substrate 100 and the surface of the base substrate 120 are made to face each other, and the surface of the oxide film 132 and the surface of the nitrogen-containing layer 121 are bonded to each other (see FIG. 3C).

Here, a pressure of approximately 1 N/cm$^2$ to 500 N/cm$^2$, more preferably approximately 1 N/cm$^2$ to 20 N/cm$^2$ is applied to one part of the single crystal semiconductor substrate 100 after the single crystal semiconductor substrate 100 and the base substrate 120 are disposed in close contact with each other with the oxide film 132 and the nitrogen-containing layer 121 interposed therebetween. Bonding between the oxide film 132 and the nitrogen-containing layer 121 begins from the part to which pressure is applied and then spontaneous bonding proceeds to the entire surface. This bonding step is performed by Van der Waals force or hydrogen bonding at the normal temperature without heat treatment. Therefore, a substrate with low heat resistance temperature, such as a glass substrate, can be used as the base substrate 120.

Note that before the single crystal semiconductor substrate 100 is attached to the base substrate 120, surface treatment is preferably performed on the oxide film 132 formed over the single crystal semiconductor substrate 100 and the nitrogen-containing layer 121 formed over the base substrate 120.

As the surface treatment, plasma treatment, ozone treatment, megasonic cleaning, two-fluid cleaning (a method of spraying functional water such as pure water or water including hydrogen with a carrier gas such as nitrogen), or a combination of these methods can be employed. In particular, by ozone treatment, megasonic cleaning, two-fluid cleaning, or the like after plasma treatment is performed on at least one of the surfaces of the oxide film 132 and the nitrogen-containing layer 121, dusts such as an organic substance on the surfaces of the oxide film 132 and the nitrogen-containing layer 121 can be removed and the surfaces can be made hydrophilic. As a result, the bonding strength of the oxide film 132 and the nitrogen-containing layer 121 can be increased.

It is preferable that after the oxide film 132 and the nitrogen-containing layer 121 are bonded to each other, heat treatment is performed to increase the bonding strength therebetween. The heat treatment temperature is set at a temperature which does not cause a crack in the embrittlement region 104, for example, a room temperature or higher and less than 400° C. Alternatively, while heating at a temperature in this range, the oxide film 132 and the nitrogen-containing layer 121 may be bonded to each other. For the heat treatment, a diffusion furnace, a heating furnace such as a resistance heating furnace, a rapid thermal annealing (RTA) apparatus, a microwave heating apparatus, or the like can be used.

In general, when heat treatment is performed at the same time as or after the bonding of the oxide film 132 and the nitrogen-containing layer 121, dehydration reaction proceeds at the bonding interface and the bonding surfaces come closer to each other. Thus, the bonding is strengthened by strengthening hydrogen bonding or forming covalent bonding. In order to promote dehydration reaction, moisture which is generated at the bonding interface by the dehydration reaction should be removed by high-temperature heat treatment. That is, in the case where the heat treatment temperature after the bonding is low, moisture which is generated at the bonding interface by the dehydration reaction cannot be removed effectively; accordingly, the dehydration reaction does not proceed and it is difficult to increase the bonding strength sufficiently.

On the other hand, in the case where an oxide film containing chlorine atoms or the like is used as the oxide film 132 as described in this embodiment, the oxide film 132 can absorb and diffuse moisture. Even in the case where the heat treatment after the bonding is performed at a low temperature, moisture which is generated at the bonding interface by the dehydration reaction can be absorbed and diffused into the oxide film 132 and thus the dehydration reaction can be promoted efficiently. In this case, even in the case where a substrate with low heat resistance such as a glass substrate is used as the base substrate 120, the bonding strength between the oxide film 132 and the nitrogen-containing layer 121 can be increased sufficiently. Further, plasma treatment is performed by applying bias voltage, whereby minute pores (micropores) are formed near the surface of the oxide film 132 to absorb and diffuse moisture efficiently. Thus, the bonding strength between the oxide film 132 and the nitrogen-containing layer 121 can be increased, even by a low-temperature heat treatment.

Figure 3D:
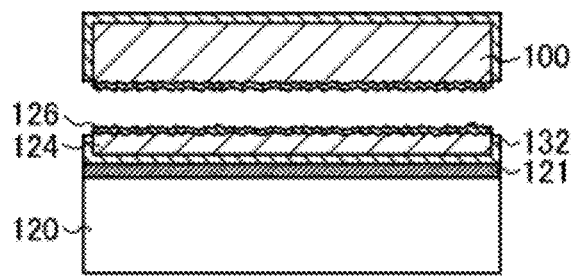

Next, heat treatment is performed to cause separation along the embrittlement region 104, whereby the single crystal semiconductor layer 124 is formed over the base substrate 120 with the oxide film 132 and the nitrogen-containing layer 121 interposed therebetween (see FIG. 3D).

When the heat treatment is performed, the element added is separated out in microvoids which are formed in the embrittlement region 104, and the internal pressure of the microvoids is increased. Then, a crack is generated in the embrittlement region 104, and the single crystal semiconductor substrate 100 is separated along the embrittlement region 104. Since the oxide film 132 is bonded to the nitrogen-containing layer 121 over the base substrate 120, the single crystal semiconductor layer 124 which is separated from the single crystal semiconductor substrate 100 is formed over the base substrate 120. Further, the temperature in this heat treatment is set so as not to exceed the strain point of the base substrate 120.

For this heat treatment, a diffusion furnace, a heating furnace such as a resistance heating furnace, a rapid thermal annealing (RTA) apparatus, a microwave heating apparatus, or the like can be used. For example, in the case where an RTA apparatus is used, the heat treatment can be performed at a heating temperature of 550° C. to 730° C. inclusive, within a process time of 0.5 minutes to 60 minutes inclusive.

Note that by performing the heat treatment in FIG. 3D without performing the heat treatment for increasing the bonding strength between the oxide film 132 and the nitrogen-containing layer 121, the heat treatment step for increasing the bonding strength between the oxide film 132 and the nitrogen-containing layer 121 and the heat treatment step for separation along the embrittlement region 104 may be performed at the same time.

Through the above steps, an SOI substrate can be manufactured where the single crystal semiconductor layer 124 is provided over the base substrate 120 with the oxide film 132 and the nitrogen-containing layer 121 interposed therebetween. By the manufacturing method described in this embodiment, even in the case where the nitrogen-containing layer 121 is used as the bonding layer, the bonding strength between the base substrate 120 and the single crystal semiconductor layer 124 can be increased, resulting in increase in reliability. As a result, an SOI substrate in which diffusion of impurities into the single crystal semiconductor layer 124 formed over the base substrate 120 can be suppressed and at the same time the base substrate 120 and the single crystal semiconductor layer 124 are firmly attached can be formed.

Further, with the structure in which a nitrogen-containing layer is provided on the base substrate side and an oxide film including halogen such as chlorine is formed on the single crystal semiconductor substrate side, the entry of an impurity element to the single crystal semiconductor substrate before the single crystal semiconductor substrate is attached to the base substrate can be suppressed. Furthermore, by forming an oxide film including halogen such as chlorine as the bonding layer provided on the single crystal semiconductor substrate side, even in the case where heat treatment after the bonding is performed at low temperature, dehydration reaction is promoted efficiently, so that the bonding strength can be increased.

Then, as described in Embodiment 1, after the oxide film 126 formed on the single crystal semiconductor layer 124 is removed, the single crystal semiconductor layer 124 is irradiated with a laser beam, whereby the crystallinity of the single crystal semiconductor layer 124 is recovered and the surface thereof is smoothed. The irradiation step of the laser beam can be performed using any of the methods and apparatuses described in the above embodiment.

Note that, although the case where the oxide film 132 is formed over the single crystal semiconductor substrate 100 and the nitrogen-containing layer 121 is formed over the base substrate 120 has been described in this embodiment, the present invention is not limited thereto. For example, the oxide film 132 and the nitrogen-containing layer may be stacked in this order over the single crystal semiconductor substrate 100, and the surface of the nitrogen-containing layer formed over the oxide film 132 and the surface of the base substrate 120 may be bonded to each other. In this case, the nitrogen-containing layer may be provided before or after forming the embrittlement region 104. Note that an oxide film (e.g., silicon oxide) may be formed over the nitrogen-containing layer, and the surface of the oxide film and the surface of the base substrate 120 may be bonded to each other.

In the case where the entry of an impurity to the single crystal semiconductor layer 124 from the base substrate 120 is not a problem, the surface of the oxide film 132 provided over the single crystal semiconductor substrate 100 and the surface of the base substrate 120 may be bonded to each other without providing the nitrogen-containing layer 121 over the base substrate 120.

Note that the structure and method described in this embodiment can be implemented in combination with any of the structures and methods described in other embodiments in this specification, as appropriate.

[Embodiment 3]

In Embodiment 3, a manufacturing method of a semiconductor device using the SOI substrate which is manufactured in any of the above embodiments will be described.

First, a manufacturing method of an n-channel thin film transistor and a p-channel thin film transistor will be described with reference to FIGS. 4A to 4D and FIGS. 5A to 5C. Various kinds of semiconductor devices can be formed by combining a plurality of thin film transistors (TFTs).

In this embodiment, the case where the SOI substrate manufactured through the steps in FIGS. 3A1 to 3A3, FIGS. 3B1 and 3B2, FIG. 3C, and FIG. 3D is used as an SOI substrate is described. It is needless to say that the SOI substrate manufactured by any of the other methods described in the above embodiments can also be used.

Figure 4A:
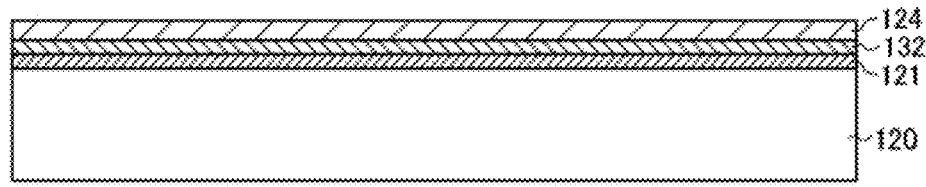
FIGS. 4A to 4D illustrate an example of a manufacturing method of a semiconductor device in which an SOI substrate is used.

FIG. 4A is a cross-sectional view of an SOI substrate manufactured using the method described with reference to FIGS. 3A1 to 3A3, FIGS. 3B1 and 3B2, FIG. 3C, and FIG. 3D.

Figure 4B:
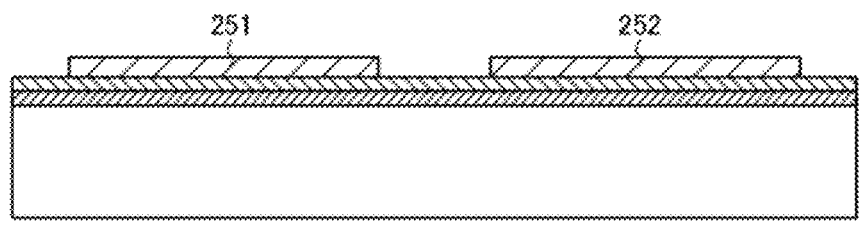

First, the single crystal semiconductor layer 124 is separated into elements by etching to form semiconductor layers 251 and 252 as illustrated in FIG. 4B. The semiconductor layer 251 is used for an n-channel TFT, and the semiconductor layer 252 is used for a p-channel TFT.

Figure 4C:
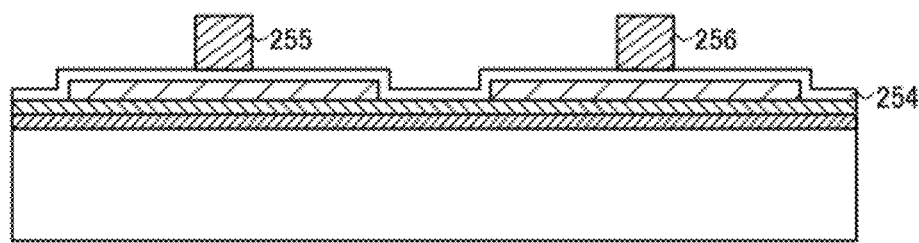

As illustrated in FIG. 4C, an insulating film 254 serving as a gate insulating film is formed over the semiconductor layers 251 and 252. Next, a gate electrode 255 is formed over the semiconductor layer 251 with the insulating film 254 interposed therebetween, and a gate electrode 256 is formed over the semiconductor layer 252 with the insulating film 254 interposed therebetween.

Note that, before the single crystal semiconductor layer 124 is etched, it is preferable to add an impurity element such as boron, aluminum, or gallium or an impurity element such as phosphorus or arsenic to the single crystal semiconductor layer 124 in order to control the threshold voltage of TFTs. For example, an impurity element is added to a region where an n-channel TFT is to be formed, and an impurity element is added to a region where a p-channel TFT is to be formed.

The gate insulating film 254 can be provided to have a single layer structure or a stacked structure using an insulating film of silicon oxide, silicon oxynitride, or silicon nitride by a CVD method, a sputtering method, a thermal oxidation method, or the like.

In addition, the gate insulating film 254 may be formed by performing plasma treatment on the semiconductor layers 251 and 252 to oxidize or nitride the surfaces of the semiconductor layers 251 and 252. For example, the gate insulating film 254 is formed by plasma treatment with a mixed gas of a rare gas such as He, Ar, Kr, or Xe, and oxygen, nitrogen oxide ($NO_2$), ammonia, nitrogen, hydrogen, or the like. In that case, if plasma is excited by introduction of a microwave, plasma with a low electron temperature and high density can be generated. The surfaces of the single crystal semiconductor layers can be oxidized or nitrided by oxygen radicals (OH radicals may be included) or nitrogen radicals (NH radicals may be included) generated by this high density plasma. By such treatment using high density plasma, an insulating film having a thickness of greater than or equal to 1 nm and less than or equal to 20 nm, typically greater than or equal to 5 nm and less than or equal to 10 nm, is formed over the single crystal semiconductor layers. Since a reaction in this case is a solid-phase reaction, interface state density between the insulating film and the single crystal semiconductor layers can be made to be extremely low. By such high density plasma treatment, since the single crystal semiconductor layers are directly oxidized (or nitrided), variation in thickness of the formed insulating film can be made extremely small. By solid-phase oxidation of the surfaces of the single crystal semiconductor layers through such high density plasma treatment, an insulating film which has favorable uniformity and low interface state density can be formed.

As for the gate insulating film 254, only the insulating film formed by high density plasma treatment may be used, or one or more of insulating films of silicon oxide, silicon oxynitride, or silicon nitride may be deposited and stacked by a CVD method, a sputtering method, or the like. In any way, a transistor formed by including the insulating film formed by the high density plasma treatment partially or wholly in the gate insulating film can have lower variation in its characteristics.

Figure 4D:
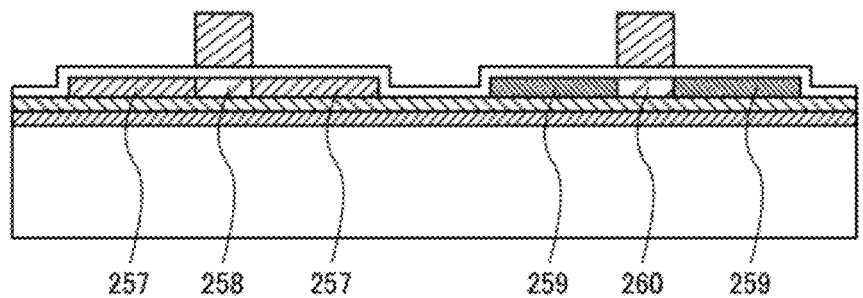

Next, as illustrated in FIG. 4D, n-type low-concentration impurity regions 257 are formed in the semiconductor layer 251, and p-type high-concentration impurity regions 259 are formed in the semiconductor layer 252. Specifically, first, the n-type low-concentration impurity regions 257 are formed in the semiconductor layer 251. In order to form the n-type low-concentration impurity regions 257, the semiconductor layer 252 where a p-channel TFT is to be formed is covered with a resist mask, and an impurity element is added to the semiconductor layer 251. As the impurity element, phosphorus or arsenic may be added. When the impurity element is added by an ion doping method or an ion implantation method, the gate electrode 255 serves as a mask, and the n-type low-concentration impurity regions 257 are formed in the semiconductor layer 251 in a self-aligned manner. A region of the semiconductor layer 251, which overlaps with the gate electrode 255, serves as a channel formation region 258.

Next, after the mask which covers the semiconductor layer 252 is removed, the semiconductor layer 251 where an n-channel TFT is to be formed is covered with a resist mask. Then, an impurity element is added to the semiconductor layer 252 by an ion doping method or an ion implantation method. As the impurity element, boron can be added. In the step of adding the impurity element, the gate electrode 256 serves as a mask, and the p-type high-concentration impurity regions 259 are formed in the semiconductor layer 252 in a self-aligned manner. The high-concentration impurity regions 259 serve as a source region and a drain region. A region of the semiconductor layer 252, which overlaps with the gate electrode 256, serves as a channel formation region 260. Here, the method is described in which the p-type high-concentration impurity regions 259 are formed after the n-type low-concentration impurity regions 257 are formed; however, the p-type high-concentration impurity regions 259 can be formed first.

Figure 5A:
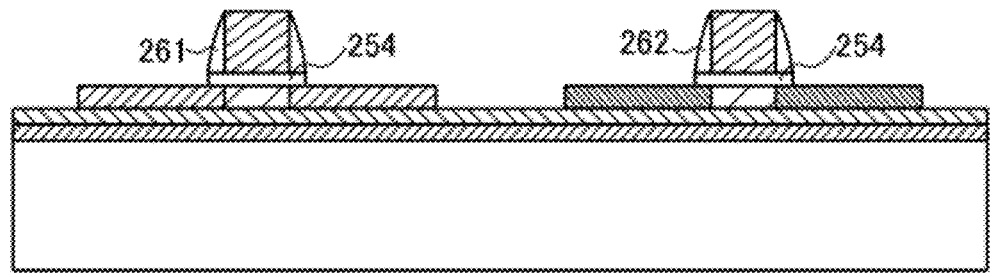
FIGS. 5A to 5C illustrate the example of the manufacturing method of the semiconductor device in which an SOI substrate is used.

Next, after the resist mask that covers the semiconductor layer 251 is removed, an insulating film having a single layer structure or a stacked layer structure, which includes a nitrogen compound such as silicon nitride or an oxide such as silicon oxide, is formed by a plasma CVD method or the like. This insulating film is anisotropically etched in a perpendicular direction, whereby sidewall insulating films 261 and 262 are formed in contact with side surfaces of the gate electrodes 255 and 256 respectively, as illustrated in FIG. 5A. By this anisotropic etching, the insulating film 254 is also etched.

Figure 5B:
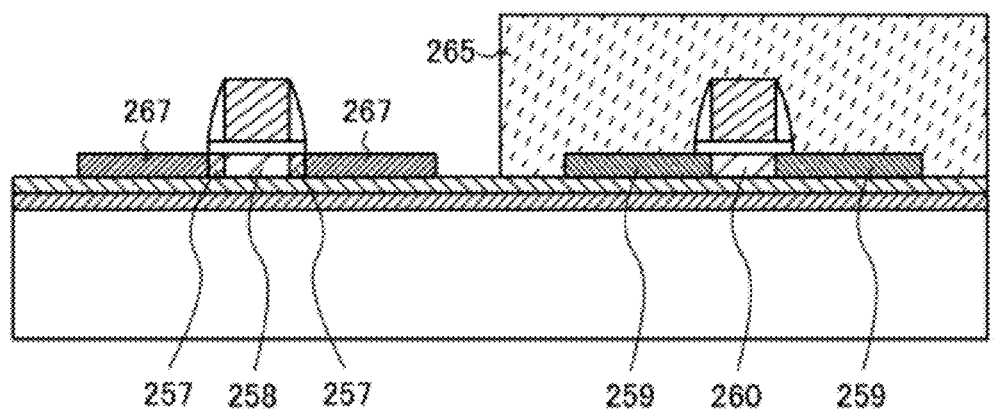

Next, as illustrated in FIG. 5B, the semiconductor layer 252 is covered with a resist 265. In order to form high-concentration impurity regions serving as a source region and a drain region in the semiconductor layer 251, an impurity element is added to the semiconductor layer 251 at high dose by an ion implantation method or an ion doping method. The gate electrode 255 and the sidewall insulating films 261 serve as a mask, and n-type high-concentration impurity regions 267 are formed. Next, heat treatment for activating the impurity element is performed.

Figure 5C:
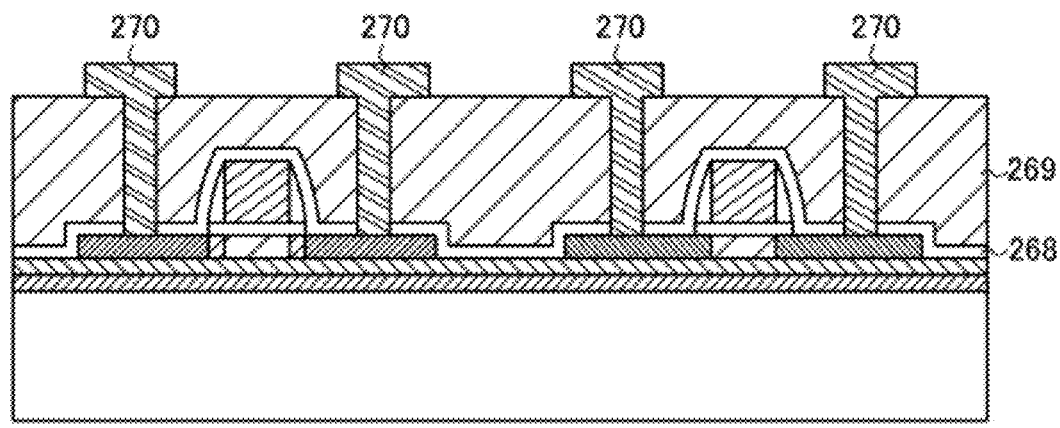

After the heat treatment for activation, an insulating film 268 containing hydrogen is formed as illustrated in FIG. 5C. After the insulating film 268 is formed, heat treatment is performed at a temperature of 350° C. to 450° C. so that hydrogen contained in the insulating film 268 diffuses into the semiconductor layers 251 and 252. The insulating film 268 can be formed by deposition of silicon nitride or silicon nitride oxide by a plasma CVD method at a process temperature of 350° C. or lower. By supply of hydrogen to the semiconductor layers 251 and 252, defects to serve as trapping centers in the semiconductor layers 251 and 252 and at the interface with the insulating film 254 can be repaired effectively.

Then, an interlayer insulating film 269 is formed. The interlayer insulating film 269 can be formed with a film having a single layer structure or a stacked layer structure selected from insulating films of inorganic materials, such as a silicon oxide film and a borophosphosilicate glass (BPSG) film, or organic resin films of polyimide, acrylic, and the like. Contact holes are formed in the interlayer insulating film 269, and wirings 270 are then formed as illustrated in FIG. 5C. The wirings 270 can be formed using a conductive film with a three-layer structure in which a low-resistance metal film such as an aluminum film or an aluminum-alloy film is sandwiched between barrier metal films. The barrier metal films can each be formed using a metal film of molybdenum, chromium, titanium, or the like.

Through the steps described above, a semiconductor device having the n-channel TFT and the p-channel TFT can be manufactured.

The concentration of an impurity element such as carbon contained in the semiconductor layers in which the channel formation regions are formed can be reduced by using the SOI substrate manufactured in Embodiment 1 as an SOI substrate used in manufacture of a semiconductor device. Accordingly, TFTs with favorable characteristics can be manufactured. For example, the carbon concentration in the semiconductor layers in which the channel formation regions are formed is desirably set at lower than or equal to $1\times10^{19}$ atoms/cm$^3$, preferably lower than or equal to $5\times10^{18}$ atoms/cm$^3$, and further preferably lower than or equal to $2.5\times10^{18}$ atoms/cm$^3$.

Although the manufacturing method of TFTs is described with reference to FIGS. 4A to 4D and FIGS. 5A to 5C, a semiconductor device with high added value can be manufactured by forming a variety of semiconductor elements such as a capacitor or a resistor as well as the TFTs. Hereinafter, specific modes of semiconductor devices will be described with reference to the drawings.

Figure 6:
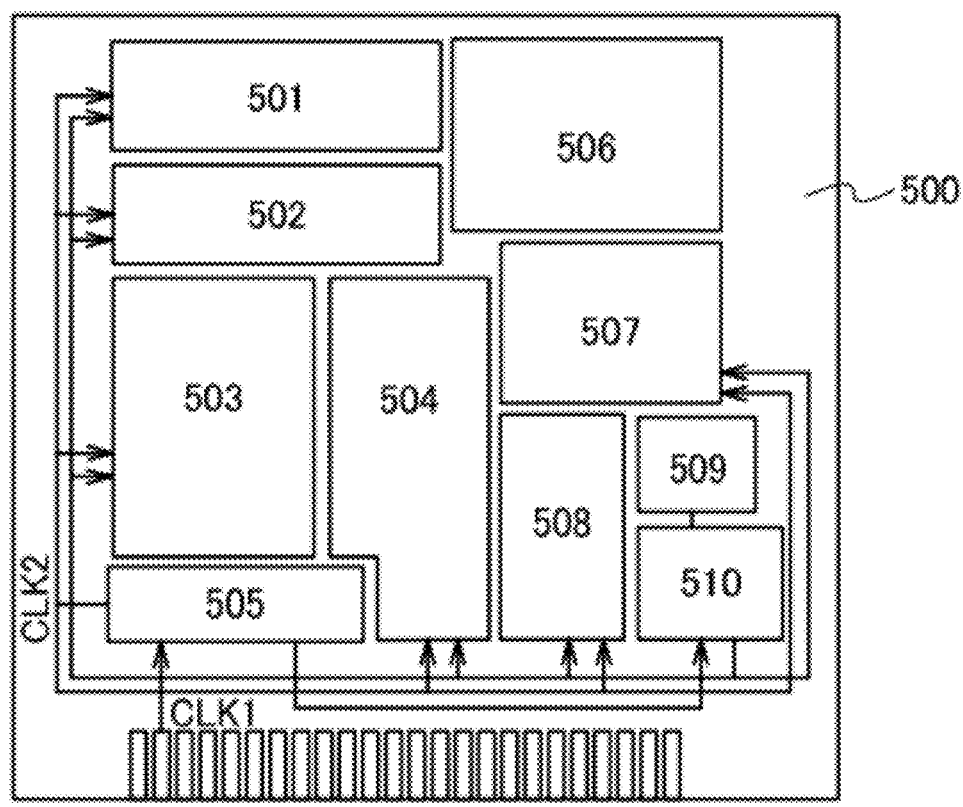
FIG. 6 illustrates an example of a semiconductor device in which an SOI substrate is used.

First, a microprocessor will be described as an example of semiconductor devices. FIG. 6 is a block diagram illustrating a structural example of a microprocessor 500.

The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory 509, and a memory interface 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction.

The ALU controller 502 generates signals for controlling the operation of the ALU 501. The interrupt controller 504 is a circuit which processes an interrupt request from an external input/output device or a peripheral circuit while the microprocessor 500 is executing a program, and the interrupt controller 504 processes an interrupt request based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 6, the internal clock signal CLK2 is input to other circuits.

Figure 7:
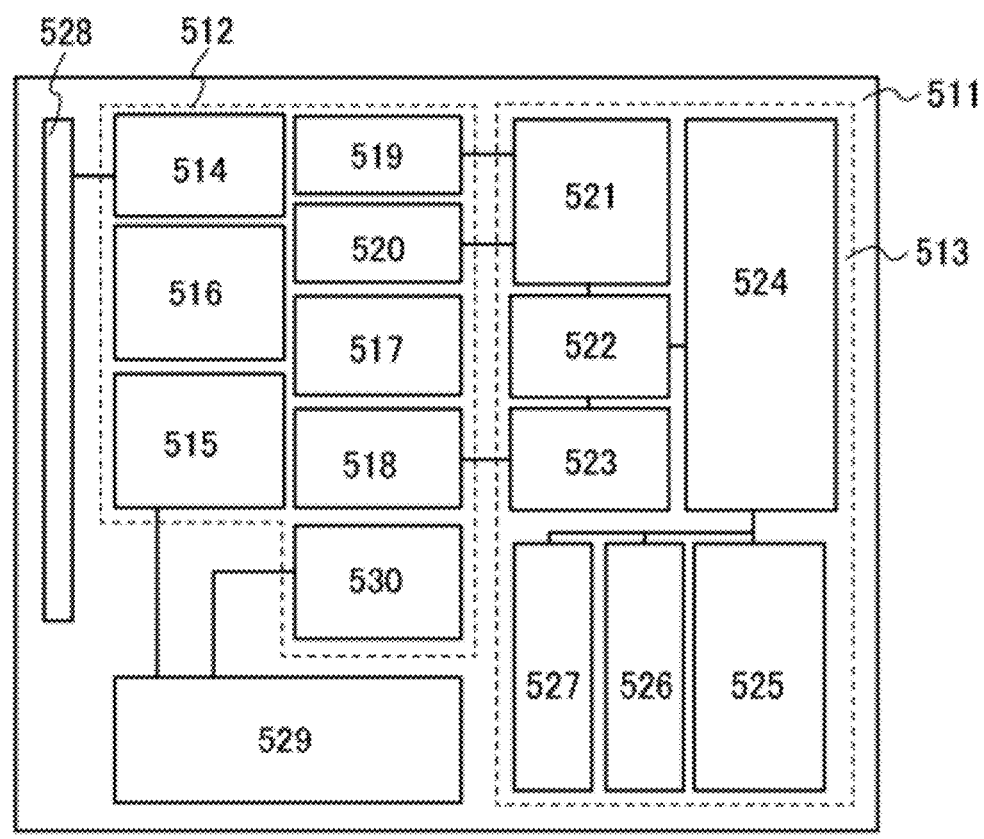
FIG. 7 illustrates an example of a semiconductor device in which an SOI substrate is used.

Next, an example of a semiconductor device having an arithmetic function and a contactless data transmission and reception function is described. FIG. 7 is a block diagram illustrating a structural example of such a semiconductor device. A semiconductor device illustrated in FIG. 7 can be called a computer that operates to transmit and receive signals to and from an external device by wireless communication (such a computer is hereinafter referred to as an "RFCPU").

As illustrated in FIG. 7, an RFCPU 511 has an analog circuit portion 512 and a digital circuit portion 513. The analog circuit portion 512 includes a resonance circuit 514 with a resonance capacitor, a rectifier circuit 515, a constant voltage circuit 516, a reset circuit 517, an oscillator circuit 518, a demodulator circuit 519, a modulator circuit 520, and a power management circuit 530. The digital circuit portion 513 includes an RF interface 521, a control register 522, a clock controller 523, a CPU interface 524, a central processing unit 525, a random-access memory 526, and a read-only memory 527.

The operation of the RFCPU 511 is roughly described below. The resonance circuit 514 generates induced electromotive force based on magnetic wave which sends a signal received by an antenna 528. The induced electromotive force is stored in a capacitor portion 529 through the rectifier circuit 515. This capacitor portion 529 is preferably formed with a capacitor such as a ceramic capacitor or an electric double layer capacitor. The capacitor portion 529 is not necessarily integrated on a substrate included in the RFCPU 511 and can be incorporated in the RFCPU 511 as a separate component.

The reset circuit 517 generates a signal for resetting and initializing the digital circuit portion 513. For example, the reset circuit 517 generates a signal which rises after rise in a power supply voltage with delay as a reset signal. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data to be transmitted.

For example, the demodulator circuit 519 is formed using a low-pass filter and binarizes a received amplitude-modulated (ASK) signal based on variation of the amplitude. In order to vary the amplitude of an amplitude-modulated (ASK) transmission signal and transmit the signal, the modulator circuit 520 changes the amplitude of a communication signal by changing a resonance point of the resonance circuit 514.

The clock controller 523 generates a control signal for changing the frequency and duty ratio of a clock signal in accordance with the power supply voltage or consumption current of the central processing unit 525. The power supply voltage is monitored by the power management circuit 530.

A signal input to the RFCPU 511 from the antenna 528 is demodulated by the demodulator circuit 519 and then decomposed into a control command, data, and the like by the RF interface 521. The control command is stored in the control register 522. The control command includes reading of data stored in the read-only memory 527, writing of data to the random-access memory 526, an arithmetic instruction to the central processing unit 525, and the like.

The central processing unit 525 accesses the read-only memory 527, the random-access memory 526, and the control register 522 via the CPU interface 524. The CPU interface 524 functions to generate an access signal for any of the read-only memory 527, the random-access memory 526, and the control register 522 based on an address the central processing unit 525 requests.

As an arithmetic method of the central processing unit 525, a method may be employed in which the read-only memory 527 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of arithmetic processing is conducted by a dedicated arithmetic circuit and the other part of the arithmetic processing is conducted by the central processing unit 525 using a program.

Next, display devices are described with reference to FIGS. 8A and 8B and FIGS. 9A and 9B.

Figure 8A:
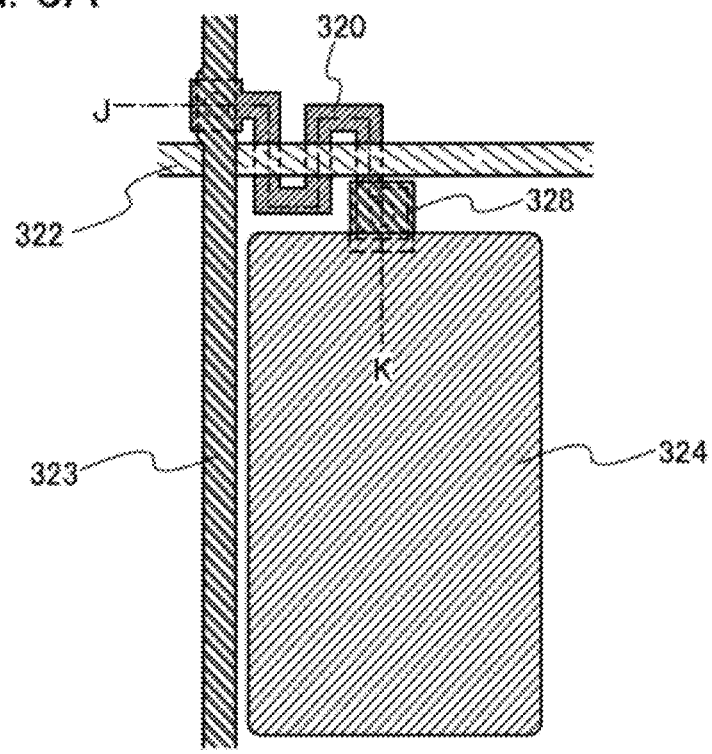
FIGS. 8A and 8B illustrate an example of a display device in which an SOI substrate is used.
Figure 8B:
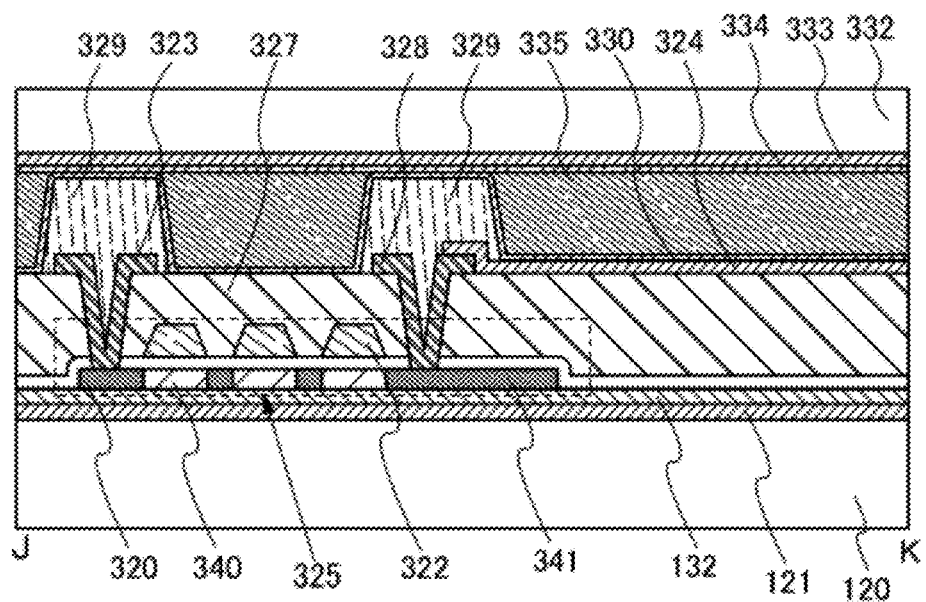

FIGS. 8A and 8B are drawings for describing a liquid crystal display device. FIG. 8A is a plan view of a pixel of the liquid crystal display device, and FIG. 8B is a cross-sectional view taken along section line J-K in FIG. 8A.

As illustrated in FIG. 8A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 to the single crystal semiconductor layer 320. The single crystal semiconductor layer 320 is a layer formed of the single crystal semiconductor layer provided over the base substrate 120 and is included in a TFT 325 of the pixel.

As an SOI substrate, the SOI substrate described in any of the above embodiments is used. As illustrated in FIG. 8B, the single crystal semiconductor layer 320 is stacked over the base substrate 120 with the oxide film 132 and the nitrogen-containing layer 121 interposed therebetween. As the base substrate 120, a glass substrate can be used. The single crystal semiconductor layer 320 of the TFT 325 is formed by element isolation of the single crystal semiconductor layer of the SOI substrate by etching. In the single crystal semiconductor layer 320, channel formation regions 340 and n-type high-concentration impurity regions 341 to which an impurity element is added are formed. A gate electrode of the TFT 325 is formed from the same layer as the scan line 322 integrally, and one of a source electrode and a drain electrode is formed from the same layer as the signal line 323 integrally.

Over an interlayer insulating film 327, the signal line 323, the pixel electrode 324, and the electrode 328 are provided. Over the interlayer insulating film 327, columnar spacers 329 are formed. An orientation film 330 is formed to cover the signal line 323, the pixel electrode 324, the electrode 328, and the columnar spacers 329. On a counter substrate 332, a counter electrode 333 and an orientation film 334 that covers the counter electrode 333 are formed. The columnar spacers 329 are formed to maintain a space between the base substrate 120 and the counter substrate 332. In the space formed by the columnar spacers 329, a liquid crystal layer 335 is formed. At connection portions of the signal line 323 and the electrode 328 with the high-concentration impurity regions 341, there are steps formed in the interlayer insulating film 327 due to formation of contact holes; thus, orientation of liquid crystal in the liquid crystal layer 335 over these connection portions are likely to be disordered. Accordingly, the columnar spacers 329 are formed in these step portions to prevent orientation disorder of liquid crystal.

Figure 9A:
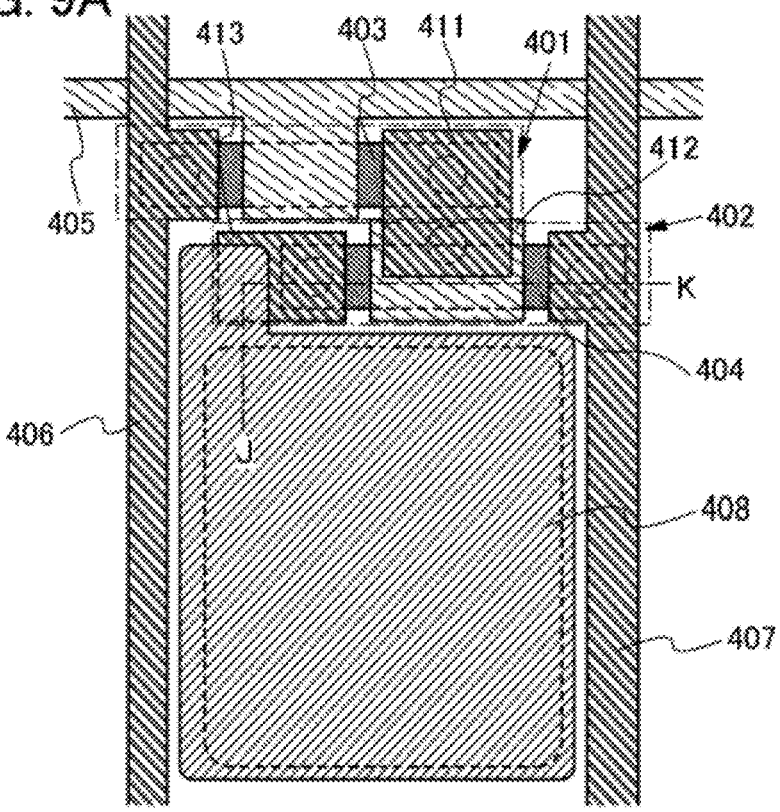
FIGS. 9A and 9B illustrate an example of a display device in which an SOI substrate is used.
Figure 9B:
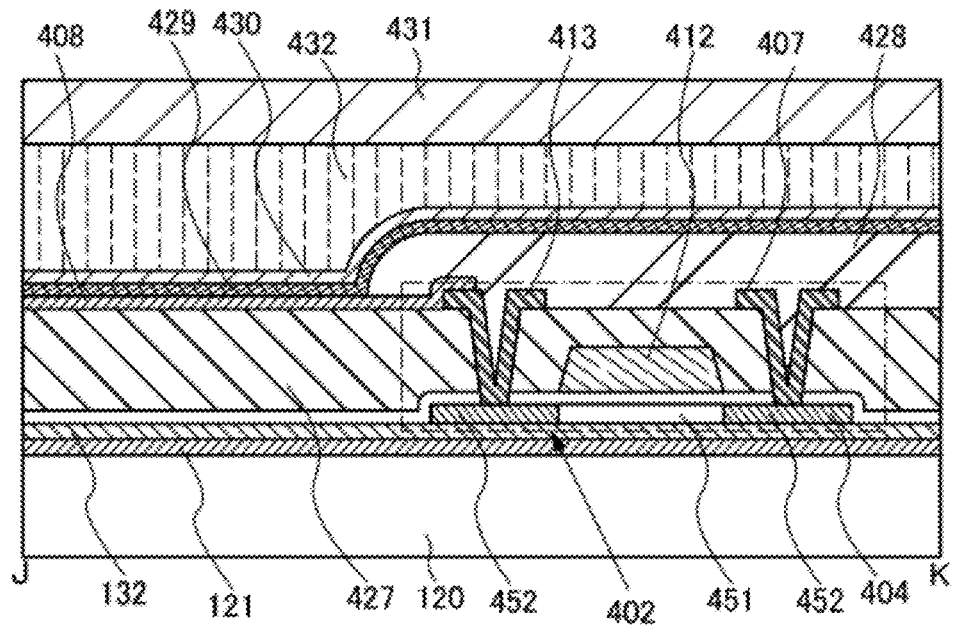

Next, an electroluminescent display device (hereinafter referred to as an "EL display device") is described with reference to FIGS. 9A and 9B. FIG. 9A is a plan view of a pixel of the EL display device, and FIG. 9B is a cross-sectional view taken along section line J-K in FIG. 9A.

As illustrated in FIG. 9A, the pixel includes a selecting transistor 401 and a display control transistor 402 that are TFTs, a scan line 405, a signal line 406, a current supply line 407, and a pixel electrode 408. Each pixel is provided with a light-emitting element having a structure in which a layer containing an electroluminescent material (EL layer) is interposed between a pair of electrodes. One of the electrodes of the light-emitting element is the pixel electrode 408. In a semiconductor layer 403, a channel formation region, a source region, and a drain region of the selecting transistor 401 are formed. In a semiconductor layer 404, a channel formation region, a source region, and a drain region of the display control transistor 402 are formed. The semiconductor layers 403 and 404 are formed of the single crystal semiconductor layer 124 that is provided over the base substrate.

In the selecting transistor 401, a gate electrode is formed from the same layer as the scan line 405 integrally; one of a source electrode and a drain electrode is formed from the same layer as the signal line 406 integrally; and the other is formed as an electrode 411. In the display control transistor 402, a gate electrode 412 is electrically connected to the electrode 411; one of a source electrode and a drain electrode is formed as an electrode 413 that is electrically connected to the pixel electrode 408; and the other is formed from the same layer as the current supply line 407 integrally.

The display control transistor 402 is a p-channel TFT. As illustrated in FIG. 9B, in the semiconductor layer 404, a channel formation region 451 and p-type high-concentration impurity regions 452 are formed. Note that, as the SOI substrate, the SOI substrate manufactured in any of the embodiments is used.

An interlayer insulating film 427 is formed to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the pixel electrode 408, and a counter electrode 430 is formed over the EL layer 429. A counter substrate 431 is provided as a reinforcing plate, and the counter substrate 431 is fixed to the base substrate 120 with a resin layer 432.

The grayscale of the EL display device is controlled by either a current drive method where the luminance of the light-emitting element is controlled by current or a voltage drive method where the luminance is controlled by voltage. The current drive method is difficult to be employed when transistors have characteristics which are largely different between pixels, and therefore, a compensation circuit for compensating variation in characteristics is needed. When the EL display device is manufactured by a manufacturing method including a manufacturing process of an SOI substrate, the selecting transistor 401 and the display control transistor 402 do not have variation in characteristics from pixel to pixel. Accordingly, the current drive method can be employed.

That is, various electronic devices can be manufactured by using SOI substrates. Examples of electronic devices include: cameras such as video cameras and digital cameras; navigation systems; sound reproduction devices (car audio systems, audio components, and the like); computers; game machines; portable information terminals (mobile computers, cellular phones, portable game machines, electronic book readers, and the like); image reproduction devices provided with recording media (specifically, devices that are each capable of reproducing audio data stored in a recording medium such as a digital versatile disc (DVD) and that each have a display device capable of displaying image data stored therein); and the like. An example of them is illustrated in FIGS. 10A to 10C.

Figure 10A:
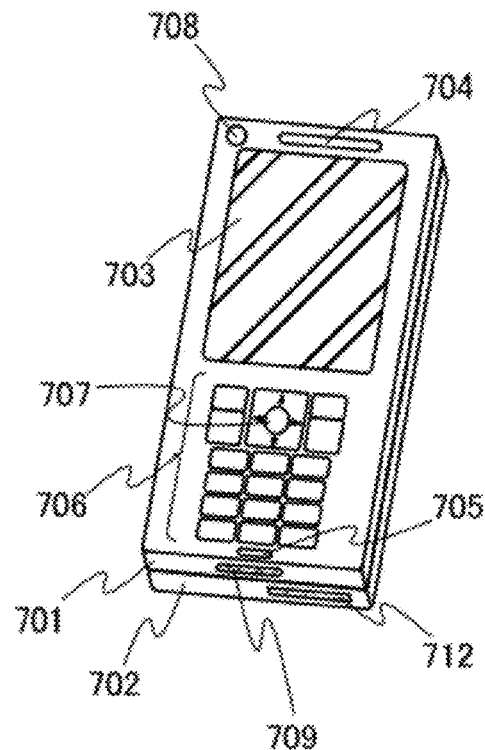
FIGS. 10A to 10C illustrate an electronic device in which an SOI substrate is used.
Figure 10B:
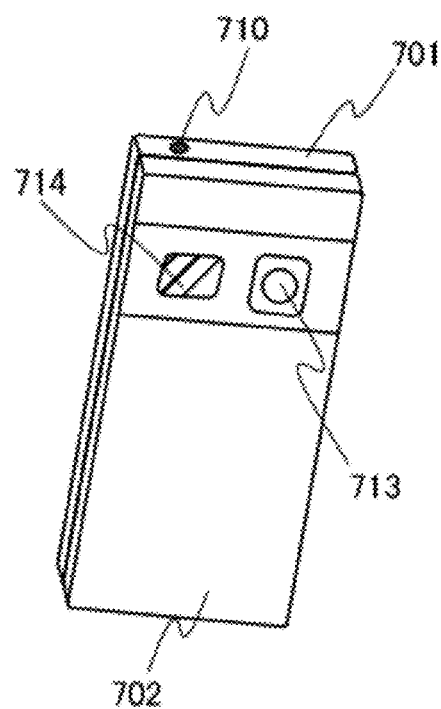
Figure 10C:
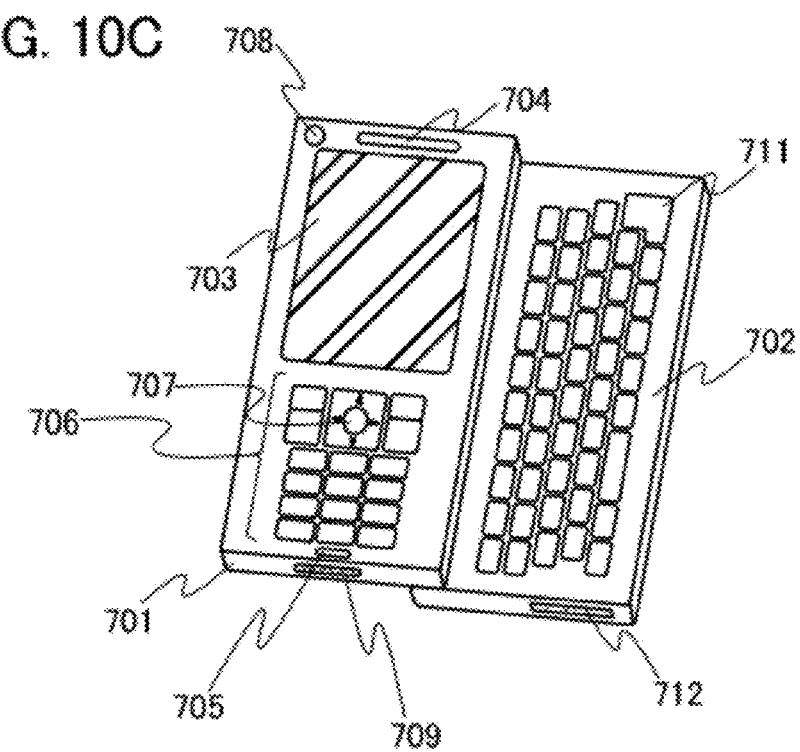

FIGS. 10A to 10C illustrate an example of a cellular phone to which the present invention is applied. FIG. 10A is a front view; FIG. 10B, a rear view; and FIG. 10C, a front view in which two housings are slid. The cellular phone has two housings, a housing 701 and a housing 702. The cellular phone is a so-called smartphone that has both a function as a cellular phone and a function as a portable information terminal and incorporates a computer to conduct a variety of data processing besides voice calls.

The cellular phone has the housings 701 and 702. The housing 701 includes a display portion 703, a speaker 704, a microphone 705, operation keys 706, a pointing device 707, a front-face camera lens 708, an external connection terminal jack 709, an earphone terminal 710, and the like. The housing 702 includes a keyboard 711, an external memory slot 712, a rear-face camera 713, a light 714, and the like. In addition, an antenna is incorporated in the housing 701.

Further, in addition to the above components, the cellular phone may incorporate a contactless IC chip, a small size memory device, or the like.

The housings 701 and 702 which overlap with each other (illustrated in FIG. 10A) can be developed by sliding as illustrated in FIG. 10C. The display portion 703 can incorporate a display panel or a display device to which the manufacturing method of the display device described in Embodiment 3 is applied. Because the display portion 703 and the front-face camera lens 708 are provided in the same plane, the cellular phone can be used as a videophone. In addition, still images and moving images can be taken with the rear-face camera 713 and the light 714 by using the display portion 703 as a viewfinder.

With the use of the speaker 704 and the microphone 705, the cellular phone can be used as a sound recording device (recorder) or a sound reproducing device. With the operation keys 706, operation of incoming and outgoing calls, simple information input for electronic mail or the like, scrolling of a viewing area displayed on the display portion, cursor motion for selecting information displayed on the display portion, and the like are possible.

If much information needs to be handled in documentation, a use as a portable information terminal, and the like, the use of the keyboard 711 is convenient. The housings 701 and 702 which overlap with each other (FIG. 10A) can be developed by sliding as illustrated in FIG. 10C. When the cellular phone is used as a portable information terminal, smooth operation can be conducted using the keyboard 711 and the pointing device 707. The external connection terminal jack 709 can be connected to an AC adaptor and various types of cables such as a USB cable, and charging and data communication with a personal computer or the like are possible. Moreover, a recording medium can be inserted into the external memory slot 712 so that a large volume of data can be stored and moved.

The housing 702 is provided with the rear-face camera 713 and the light 714 on its rear face (FIG. 10B), and still images and moving images can be taken using the display portion 703 as a viewfinder.

Furthermore, in addition to the above-described functions, the cellular phone may also have an infrared communication function, a USB port, a television one-segment broadcasting receiving function, a contactless IC chip, an earphone jack, or the like.

The electronic device illustrated in FIGS. 10A to 10C can be manufactured by application of the aforementioned manufacturing method of a transistor and a display device.

Note that the structure and method described in this embodiment can be implemented in combination with any of the structures and methods described in other embodiments in this specification, as appropriate.

EXAMPLE 1

In Example 1, the examined effect on how much the impurity element is prevented from being taken into the single crystal semiconductor layer by setting the number of times the single crystal semiconductor layer is melted in the laser irradiation step to one will be described. To be specific, the profiles of the carbon concentration due to an impurity taken into the single crystal semiconductor layer were compared between the case where the number of times the single crystal semiconductor layer is melted is one and the case where the number of melting times is plural (ten).

Hereinafter, a manufacturing method of an SOI substrate according to Example 1 will be described.

First, a single crystal semiconductor substrate was prepared and subjected to thermal oxidation treatment, so that a silicon oxide film serving as an insulating layer was formed. The temperature of the thermal oxidation treatment was 950° C., and the thickness of the insulating layer was 100 nm. In addition, an atmosphere including HCl at 3 vol % with respect to oxygen was used as the atmosphere of the thermal oxidation treatment.

In this example, a single crystal silicon wafer was used as the single crystal semiconductor substrate, and a single crystal silicon layer was formed over a base substrate. The single crystal silicon wafer is a square substrate having 5 inches on each side. In addition, the crystal orientation on its main surface is (100) and the crystal orientation on its side surface is <110>, and the conductivity of the single crystal silicon wafer is p-type.

After the thermal oxidation treatment of the single crystal semiconductor substrate, irradiation with hydrogen ions was performed with an ion doping apparatus in order to form an embrittlement region in the single crystal semiconductor substrate. A 100% hydrogen gas was used as a source gas, and the single crystal semiconductor substrate was irradiated with ions in plasma generated by excitation of the hydrogen gas which were accelerated by an electric field without mass separation. Accordingly, the embrittlement region was formed. When the hydrogen gas was excited with the ion doping apparatus, three kinds of ion species ($H^+$, $H_2^+$, $H_3^+$) were generated, and approximately 70% of the hydrogen ion species that were generated from the hydrogen gas was $H_3^+$. Conditions of hydrogen ion doping were such that the acceleration voltage was 50 kV, the beam current density was 5 $\mu A/cm^2$, and the dose was $1.8 \times 10^{16}$ ions/$cm^2$.

Next, the base substrate and the single crystal semiconductor substrate were subjected to ultrasonic cleaning in pure water, and then subjected to cleaning in pure water containing ozone. Then, a surface of the base substrate and an insulating layer formed on the single crystal semiconductor substrate were disposed in close contact so as to be bonded to each other.

In this example, a non-alkali glass substrate (product name: AN100) was used as the base substrate. The AN100 is a glass substrate having physical properties of a specific gravity of 2.51 g/$cm^3$, a Poisson's ratio of 0.22, a Young's modulus of 77 GPa, a two-axes elastic coefficient of 98.7 GPa, and a coefficient of thermal expansion of $38 \times 10^{-7}$/° C.

Next, heat treatment was performed at 200° C. for 2 hours in a heating furnace to increase the bonding strength between the base substrate and the silicon oxide film. Then, heat treatment was performed at 600° C. for 2 hours in a heating furnace, so that the single crystal semiconductor substrate was separated using the embrittlement region as a boundary. Thus, a single crystal semiconductor layer was formed over the base substrate with the insulating layer interposed therebetween. The thickness of the single crystal semiconductor layer was approximately 140 nm.

Next, the surface of the single crystal semiconductor layer was treated with hydrofluoric acid diluted at a rate of 1:100, so that a native oxide film formed on the surface was removed. Then, the single crystal semiconductor layer was irradiated with a laser beam so as to be melted and recrystallized.

A XeCl excimer laser emitting a beam with a wavelength of 308 nm was used as a laser, and the laser beam was condensed by an optical system so that the beam shape on the irradiation surface was a linear shape of 300 $\mu$m×130 mm approximately. The pulse width of the laser beam is 20 nsec, and the repetition rate of the laser beams is 30 Hz. During the laser irradiation, a nitrogen gas was sprayed onto the irradiation region at room temperature, and the energy density on the irradiation surface was 679 mJ/$cm^2$.

In the case where the number of times the single crystal semiconductor layer was melted is one, the single crystal semiconductor layer was irradiated with one shot of a laser beam. In the case where the number of times the single crystal semiconductor layer was melted is ten, ten shots of laser irradiation was performed per region of the single crystal semiconductor layer, without scanning with a laser beam. In this example, the repetition rate of laser beams is as low as 30 Hz, and the surface portion of the single crystal semiconductor layer is solidified during the time from one shot to the next shot. Accordingly, by irradiating the same region with ten shots of laser beams, the number of times the single crystal semiconductor layer is melted per region can be set to ten.

Figure 11:
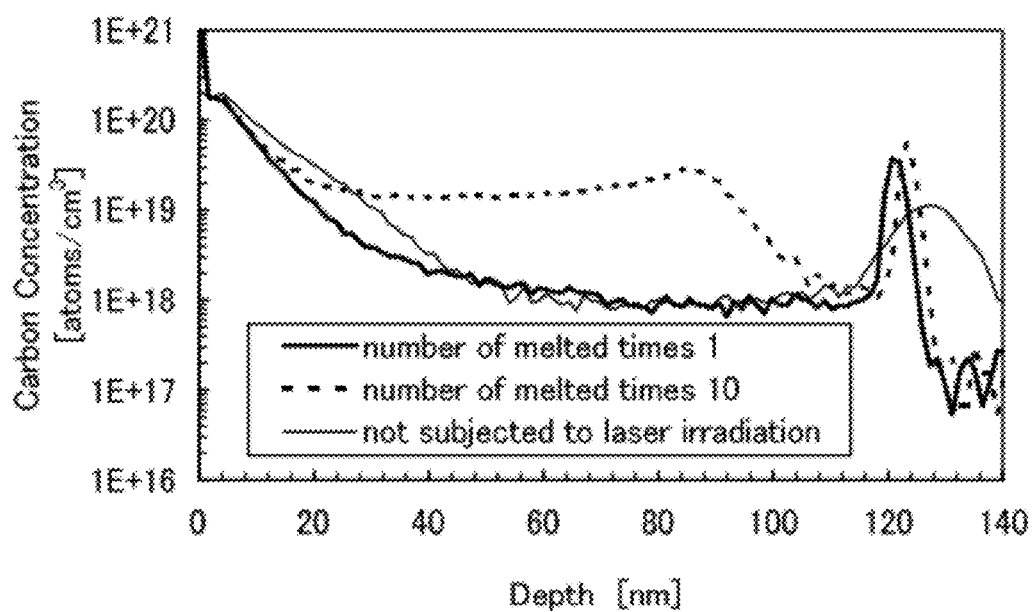
FIG. 11 shows results of analysis of the carbon concentration in single crystal semiconductor layers.

To examine the concentration of an impurity element in the single crystal semiconductor layer before and after the laser irradiation treatment, the concentration of carbon in the single crystal semiconductor layer was analyzed by secondary ion mass spectrometry (SIMS). FIG. 11 shows a carbon concentration profile in a depth direction of the single crystal semiconductor layer, which was analyzed by SIMS. In FIG. 11, the vertical axis indicates the carbon concentration, and the horizontal axis indicates the depth from the surface of the single crystal semiconductor layer. In FIG. 11, the thin solid line represents a concentration profile of carbon in the single crystal semiconductor layer after removal of the surface oxide film and before the laser irradiation. The thick solid line represents a concentration profile of carbon in the single crystal semiconductor layer which was melted once. In addition, the thick broken line represents a concentration profile of carbon in the single crystal semiconductor layer which was melted ten times.

From FIG. 11, it was found that in the case where laser irradiation was performed after the removal of the oxide film and the number of times the single crystal semiconductor layer was melted was one, the carbon concentration was almost equivalent to that in the single crystal semiconductor layer which was not subjected to laser irradiation, and increase in carbon concentration due to the laser irradiation was suppressed. On the other hand, in the case where laser irradiation was performed after the removal of the oxide film and the number of times the single crystal semiconductor layer was melted was ten, the carbon concentration was increased as compared to that of the single crystal semiconductor layer which was not subjected to laser irradiation. This is because carbon atoms in the surface oxide film which was formed at the time of solidification of the single crystal semiconductor layer that was once melted were taken into the single crystal semiconductor layer through the subsequent melting process.

Further, in FIG. 11, in the case where the number of times the single crystal semiconductor layer is melted is one, the concentration of carbon contained in the single crystal semiconductor layer is roughly $5 \times 10^{18}$ atoms/cm$^3$ or less; thus, it can be concluded that increase in carbon concentration can be sufficiently suppressed.

Note that the structure and method described in this example can be implemented in combination with any of the structures and methods described in other embodiments and examples in this specification, as appropriate.

EXAMPLE 2

In Example 2, the measurement result of the amount of carbon contained in the single crystal semiconductor layer which is provided over a base substrate and irradiated with a laser beam, will be described.

Samples evaluated in this example will be described. First, a single crystal silicon substrate was used as a single crystal semiconductor substrate, and after a native oxide film formed naturally on the surface of the single crystal silicon substrate was removed, the single crystal silicon substrate was soaked in ozone water including hydroxyl radicals for approximately 120 seconds. In this manner, a silicon oxide film was formed on the surface of the single crystal silicon substrate.

Next, the single crystal silicon substrate was irradiated with hydrogen ions through the oxide film by an ion doping method, so that an embrittlement region was formed in the single crystal silicon substrate. Detailed conditions were such that an ion doping apparatus was used, the acceleration voltage was 80 kV, the dose was $2.2 \times 10^{16}$ ions/cm$^2$, the beam current density was 5 μA/cm$^2$, and the flow rate of a hydrogen gas was 50 sccm. Next, the silicon oxide film formed on the single crystal silicon substrate was removed, and then a silicon oxide film with a thickness of 100 nm was formed using TEOS and $O_2$ and a silicon nitride oxide film with a thickness of 50 nm there over was formed.

Then, a glass substrate was used as the base substrate and was bonded to the silicon nitride oxide film on the side on which the embrittlement region was formed. After heat treatment is performed, separation is caused along the embrittlement region, so that an SOI substrate in which a single crystal silicon layer was provided over the glass substrate with the silicon nitride oxide film and the silicon oxide film interposed therebetween was manufactured. The thickness of the single crystal silicon layer after separation was 320 nm.

Next, after an oxide film formed on the single crystal silicon layer provided over the glass substrate was removed, laser irradiation was performed. A laser used in this example was a continuous wave Nd:YVO$_4$ laser. The wavelength of the laser beam was 532 nm, the major axis of the beam shape was 0.5 mm and the minor axis thereof was 20 μm, the scanning speed was 80 cm/sec, the output of the laser beam was 23.5 W, and the irradiation atmosphere was air atmosphere. The laser irradiation time per region can be calculated from the scanning speed and the minor axis of the beam. In this example, since the minor axis of the beam is 20 μm and the scanning speed is 80 cm/sec, the irradiation time per region of the single crystal silicon layer is 25 μsec.

Next, the concentration of carbon contained in the single crystal semiconductor layer after irradiation with the laser beam was measured by secondary ion mass spectroscopy (SIMS). For comparison, the concentration of carbon in the single crystal silicon layer which is not subjected to laser irradiation after the removal of the surface oxide film was measured too, by SIMS.

Figure 12:
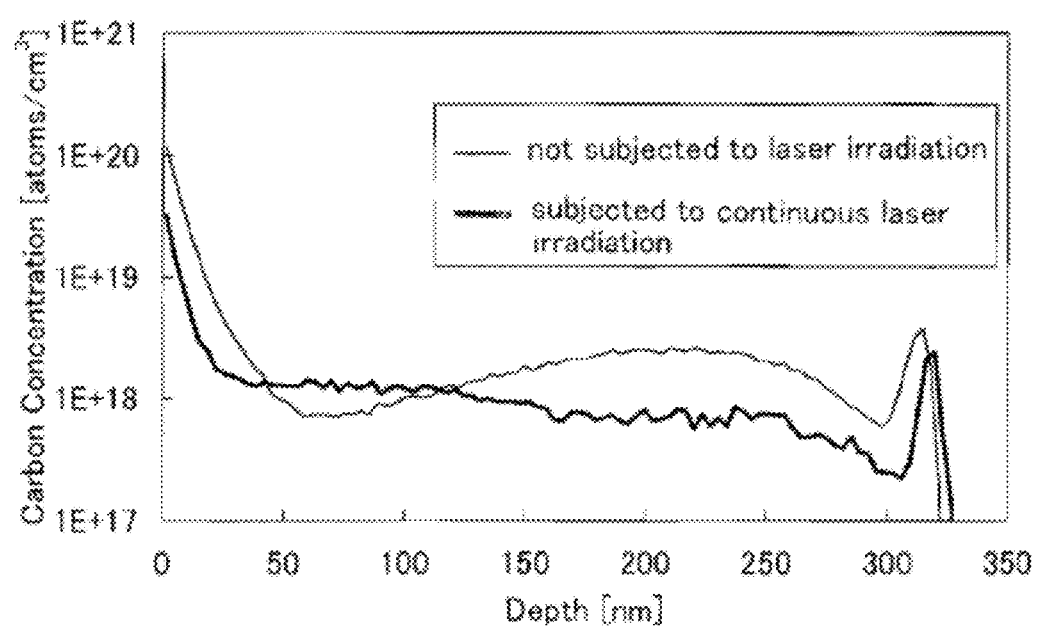
FIG. 12 shows results of analysis of the carbon concentration in single crystal semiconductor layers.

FIG. 12 shows a carbon concentration profile in a depth direction of the single crystal silicon layer formed over the glass substrate, which was analyzed by SIMS. In FIG. 12, the horizontal axis indicates the depth (nm) of the single crystal semiconductor layer, and the vertical axis indicates the carbon concentration (atoms/cm$^3$). In FIG. 12, the thin solid line represents a concentration profile of carbon contained in the single crystal silicon layer which is not subjected to laser irradiation. The thick solid line represents a concentration profile of carbon contained in the single crystal silicon layer after laser irradiation. Since the thickness of the single crystal silicon layer is 320 nm, the region deeper than 320 nm is a region of the silicon oxide film.

As a result from FIG. 12, it was found that the concentration of carbon contained in the single crystal silicon layer which is not subjected to laser irradiation is not much different from that of carbon contained in the single crystal silicon layer which is subjected to laser irradiation. Accordingly, it could be confirmed that by laser irradiation after removal of the oxide film formed on the single crystal silicon layer, carbon contained in the oxide film is prevented from being taken into the single crystal silicon layer, whereby increase in concentration of carbon contained in the single crystal silicon layer can be suppressed.

This application is based on Japanese Patent Application serial no. 2008-263761 filed with Japan Patent Office on Oct. 10, 2008, the entire contents of which are hereby incorporated by reference.

What is claimed is:

1. A manufacturing method of an SOI semiconductor device, comprising the steps of:
   a first step of forming an embrittlement region in a single crystal semiconductor substrate by irradiating the single crystal semiconductor substrate with accelerated ions;
   a second step of bonding the single crystal semiconductor substrate and a base substrate to each other with an insulating layer interposed therebetween;
   a third step of forming a single crystal semiconductor layer over the base substrate with the insulating layer interposed therebetween by heating the single crystal semiconductor substrate to cause separation using the embrittlement region as a boundary;
   a fourth step of removing an oxide film formed on a surface of the single crystal semiconductor layer;

a fifth step of melting a portion of the surface of the single crystal semiconductor layer by irradiating the portion of the surface of the single crystal semiconductor layer with a laser beam in a chamber with a reduced-pressure atmosphere; and a sixth step of forming an insulating film over the single crystal semiconductor layer, wherein the fourth step is followed by the fifth step, and the fifth step is followed by the sixth step, wherein the number of times that the portion of the surface of the single crystal semiconductor layer is melted from the fourth step to the sixth step is one, and wherein the repetition rate of the laser beam is 10 MHz or higher.

2. The manufacturing method of the SOI semiconductor device according to claim 1,
wherein the single crystal semiconductor layer has a thickness of 200 nm or more.

3. The manufacturing method of the SOI semiconductor device according to claim 1,
wherein the single crystal semiconductor layer is partially melted in the fifth step.

4. The manufacturing method of the SOI semiconductor device according to claim 1,
wherein the single crystal semiconductor layer irradiated with the laser beam has a carbon concentration of $5\times10^{18}$ atoms/cm$^3$ or less.

5. The manufacturing method of the SOI semiconductor device according to claim 1,
wherein a glass substrate is used as the base substrate.

6. A manufacturing method of an SOI semiconductor device, comprising the steps of:
a first step of forming an embrittlement region in a single crystal semiconductor substrate by irradiating the single crystal semiconductor substrate with accelerated ions;

a second step of bonding the single crystal semiconductor substrate and a base substrate to each other with an insulating layer interposed therebetween;

a third step of forming a single crystal semiconductor layer over the base substrate with the insulating layer interposed therebetween by heating the single crystal semiconductor substrate to cause separation using the embrittlement region as a boundary;

a fourth step of performing plasma treatment on a surface of the single crystal semiconductor layer;

a fifth step of melting a portion of the surface of the single crystal semiconductor layer by irradiating the portion of the surface of the single crystal semiconductor layer with a laser beam; and a sixth step of forming an insulating film over the single crystal semiconductor layer, wherein the fourth step is followed by the fifth step, and the fifth step is followed by the sixth step, wherein the number of times that the portion of the surface of the single crystal semiconductor layer is melted from the fourth step to the sixth step is one, and wherein the repetition rate of the laser beam is 10 MHz or higher.

7. The manufacturing method of the SOI semiconductor device according to claim 6,
wherein the single crystal semiconductor layer has a thickness of 200 nm or more.

8. The manufacturing method of the SOI semiconductor device according to claim 6,
wherein the single crystal semiconductor layer is partially melted in the fifth step.

9. The manufacturing method of the SOI semiconductor device according to claim 6,
wherein the single crystal semiconductor layer irradiated with the laser beam has a carbon concentration of $5\times10^{18}$ atoms/cm$^3$ or less.

10. The manufacturing method of the SOI semiconductor device according to claim 6,
wherein a glass substrate is used as the base substrate.

11. A manufacturing method of an SOI semiconductor device, comprising the steps of:
a first step of forming an embrittlement region in a single crystal semiconductor substrate by irradiating the single crystal semiconductor substrate with accelerated ions;

a second step of bonding the single crystal semiconductor substrate and a base substrate to each other with an insulating layer interposed therebetween;

a third step of forming a single crystal semiconductor layer over the base substrate with the insulating layer interposed therebetween by heating the single crystal semiconductor substrate to cause separation using the embrittlement region as a boundary;

a fourth step of removing an oxide film formed on a surface of the single crystal semiconductor layer;

a fifth step of melting a portion of the surface of the single crystal semiconductor layer by irradiating the portion of the surface of the single crystal semiconductor layer with a laser beam; and a sixth step of forming an insulating film over the single crystal semiconductor layer, wherein the fourth step is followed by the fifth step, and the fifth step is followed by the sixth step, wherein the number of times that the portion of the surface of the single crystal semiconductor layer is melted from the fourth step to the sixth step is one, and wherein the repetition rate of the laser beam is 10 MHz or higher.

12. The manufacturing method of the SOI semiconductor device according to claim 11,
wherein the single crystal semiconductor layer has a thickness of 200 nm or more.

13. The manufacturing method of the SOI semiconductor device according to claim 11,
wherein the single crystal semiconductor layer is partially melted in the fifth step.

14. The manufacturing method of the SOI semiconductor device according to claim 11,
wherein the single crystal semiconductor layer irradiated with the laser beam has a carbon concentration of $5\times10^{18}$ atoms/cm$^3$ or less.

15. The manufacturing method of the SOI semiconductor device according to claim 11,
wherein a glass substrate is used as the base substrate.

* * * * *